United States Patent
Shiga

(10) Patent No.: US 7,859,910 B2
(45) Date of Patent: Dec. 28, 2010

(54) NONVOLATILE SEMICONDUCTOR MEMORY DEVICE

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 12/333,656

(22) Filed: Dec. 12, 2008

(65) Prior Publication Data
US 2009/0154244 A1    Jun. 18, 2009

(30) Foreign Application Priority Data
Dec. 14, 2007    (JP) .............................. 2007-323166

(51) Int. Cl.
*G11C 16/04*    (2006.01)
(52) U.S. Cl. .......................... 365/185.24; 365/185.28; 365/185.29; 365/185.33
(58) Field of Classification Search ............. 365/185.24
See application file for complete search history.

(56) References Cited

U.S. PATENT DOCUMENTS

| | | | |
|---|---|---|---|
| 5,555,204 A | 9/1996 | Endoh et al. | |
| 6,188,611 B1 | 2/2001 | Endoh et al. | |
| 6,434,055 B2 * | 8/2002 | Tanaka et al. | 365/185.3 |
| 7,206,224 B1 * | 4/2007 | Randolph et al. | 365/185.03 |
| 7,437,498 B2 * | 10/2008 | Ronen | 711/103 |
| 7,453,731 B2 * | 11/2008 | Tu et al. | 365/185.18 |
| 7,688,632 B2 * | 3/2010 | Nagashima et al. | 365/185.19 |
| 2002/0080654 A1 | 6/2002 | Shiga et al. | |
| 2008/0062768 A1 | 3/2008 | Li et al. | |

FOREIGN PATENT DOCUMENTS

JP    7-169284    7/1995

OTHER PUBLICATIONS

G.J. Hemink, et al., "Fast and Accurate Programming Method for Multi-level NAND EEPROMs", Symposium on VLSI Technology Digest of Technical Papers, 10B-4, 1995, pp. 129-130.

* cited by examiner

*Primary Examiner*—Son L Mai
(74) *Attorney, Agent, or Firm*—Oblon, Spivak, McClelland, Maier & Neustadt, L.L.P.

(57) ABSTRACT

A nonvolatile semiconductor memory device according to one embodiment of the present invention includes: a memory cell array including a plurality of word lines; a parameter storage part which stores a parameter related to a programming voltage which is applied to a word line for programming data; a word line selection circuit which selects a word line among the plurality of word lines which is connected to a memory cell to be programmed with data; a voltage application circuit which applies a programming voltage to the selected word line according to the parameter; a verify circuit which performs verification of programmed data; a control part which outputs a signal for selecting a word line and repeats the operations of the voltage application circuit until the verification is successful; a calculation circuit which calculates an average value of the number of times the control part repeats the operations of the voltage application circuit per each word line; and a parameter setting circuit which sets the parameter using the average value calculated.

20 Claims, 19 Drawing Sheets

(a)

(b)

NONVOLATILE SEMICONDUCTOR MEMORY DEVICE

CROSS REFERENCE TO RELATED APPLICATION

This application is based upon and claims the benefit of priority from the prior Japanese Patent Application No. 2007-323166, filed on Dec. 14, 2007, the entire contents of which are incorporated herein by reference.

BACKGROUND OF THE INVENTION

1. Field of the Invention

This invention is related to a nonvolatile semiconductor memory device which comprises reprogrammable nonvolatile memory cells.

2. Description of the Related Art

A memory cell transistor including a floating gate or a charge storage layer is known as a nonvolatile memory cell (hereinafter referred to as a memory cell). In such a memory cell, data is stored by utilizing the phenomenon whereby the threshold of the memory cell changes according to the amount of charges stored in the floating gate or a charge storage layer. Therefore, the control of the threshold of a memory cell is important.

As a method for controlling the threshold of a memory cell, a method is known wherein the voltage applied to the memory cell is stepped up after each verification of the threshold of the memory cell while programming data (ref. Japan Patent Laid Open H7-169284, Hemink et al., Symposium on VLSI Technology, 1995, pp. 129-130). Concerning data erasure, memory cells are arranged in block units and erasure is performed in blocks. When the data which is stored in the memory cells belonging to a block is to be erased, the voltage applied to a well layer is stepped up after each verification of the threshold of all the memory cells belonging to the block until an erased state is reached.

BRIEF SUMMARY OF THE INVENTION

The present invention provides a nonvolatile semiconductor memory device equipped with a circuit for adjusting an initial voltage (hereinafter referred to as an initial program bias voltage) of voltages applied to a memory cell in a nonvolatile semiconductor memory device when programming data to a memory cell wherein the voltage applied to the memory cell is stepped up after each verification.

One embodiment of the present invention provides a nonvolatile semiconductor memory device comprising: a memory cell array including a plurality of word lines which connect a plurality of memory cells; a parameter storage part which stores a parameter related to a programming voltage which is applied to a word line connected to a memory cell to be programmed with data; a word line selection circuit which selects a word line among said plurality of word lines which is connected to a memory cell to be programmed with data; a voltage application circuit which applies a programming voltage to a word line according to said parameter, said word line being selected by said word line selection circuit; a verify circuit which performs verification of data which is programmed to a plurality of memory cells which are connected to said word line selected by said word line selection circuit; a control part which outputs a signal for selecting a word line to said word line selection circuit, and repeats the operations of said voltage application circuit until said verification by said verify circuit is successful; a calculation circuit which calculates an average value of the number of times said control part repeats said operations of said voltage application circuit per each word line; and a parameter setting circuit which sets said parameter using said average value calculated by said calculation circuit.

Another embodiment of the present invention provides a nonvolatile semiconductor memory device comprising: a memory cell array including a plurality of blocks having a plurality of memory cells; a parameter storage part which stores a parameter related to an erasure voltage which is applied when data stored in memory cells of a block is erased; a block selection circuit which selects a block in which data is to be erased from memory cells of said block; an erasure voltage application circuit which applied an erasure voltage according to said parameter;

a verify circuit which verifies whether data which is stored in memory cells of said selected block is erased or not; an erasure control part which outputs a signal for selecting a block to said block selection circuit, and repeats the operations of said erasure voltage application circuit until said verification by said verify circuit is successful; a calculation circuit which calculates an average value of the number of times said erase control part repeats said operations of said erasure voltage application circuit per each block; and a parameter setting circuit which sets said parameter using said average value calculated by said calculation circuit.

Still another embodiment of the present invention provides an operation method of a nonvolatile semiconductor memory device comprising: reading a value of a parameter related to a programming voltage applied to a word line connected to a memory cell to be programmed with data; selecting a word line connected to said memory cell to be programmed from a plurality of word lines which connect a plurality of said memory cells; repeating application of a programming voltage according to said value of said parameter to said selected word line until a verification of data programmed to a said plurality of memory cells connected to said selected word line is successful; calculating an average value of the number of times said programming voltage is applied according to said parameter per said word line: and setting said parameter using said calculated average value.

DETAILED DESCRIPTION OF THE INVENTION

The preferred embodiments to realize the present invention are explained below in detail while referring to the diagrams. The present invention, however, can be realized in many different embodiments and is not to be interpreted as being limited to the embodiments described below. Furthermore, the same structural elements have the same symbols and are not explained to avoid repetition where appropriate.

First Embodiment

Figure 1:
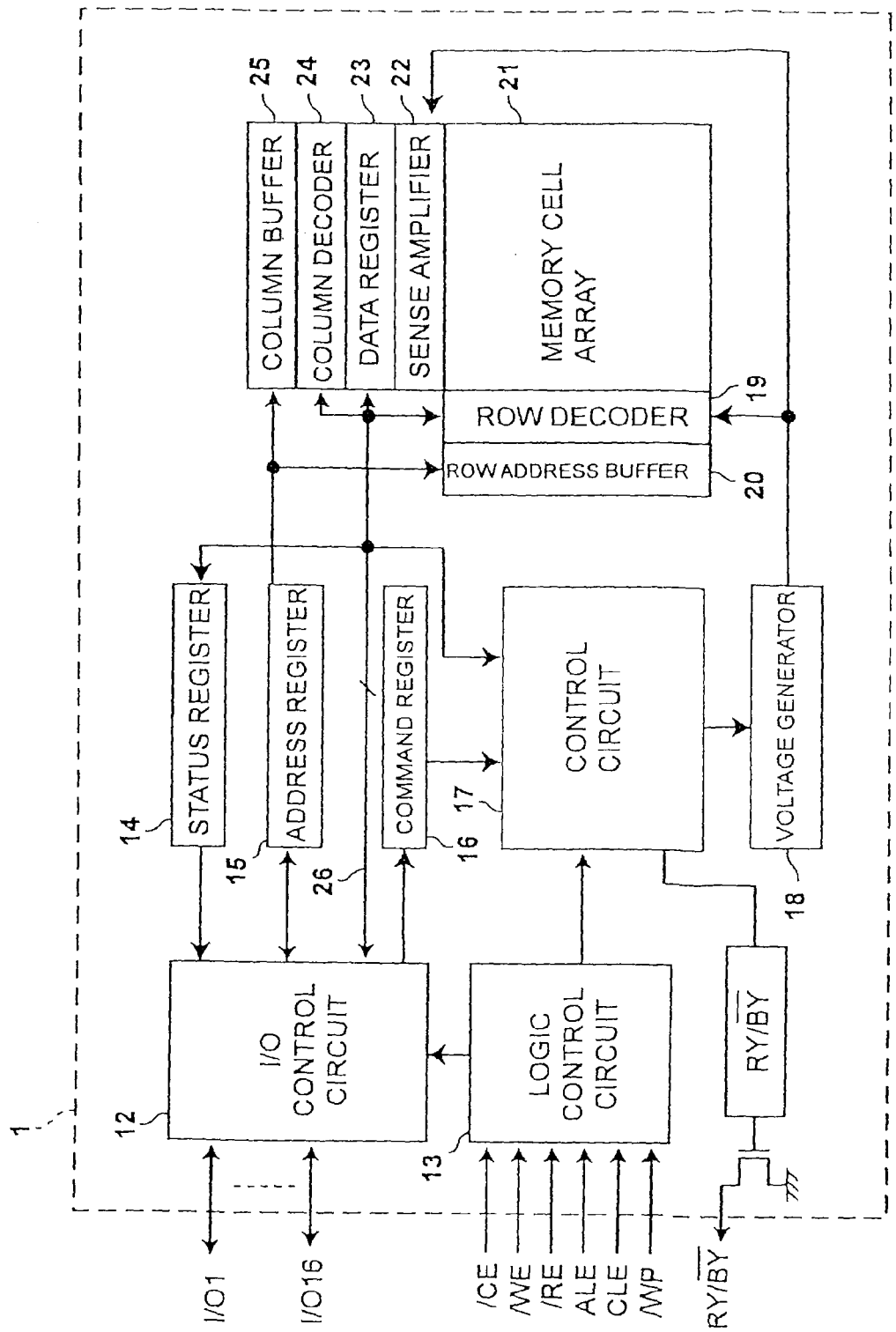
FIG. 1 is a function block diagram of a nonvolatile semiconductor memory device related to one embodiment of the present invention.
Figure 2:
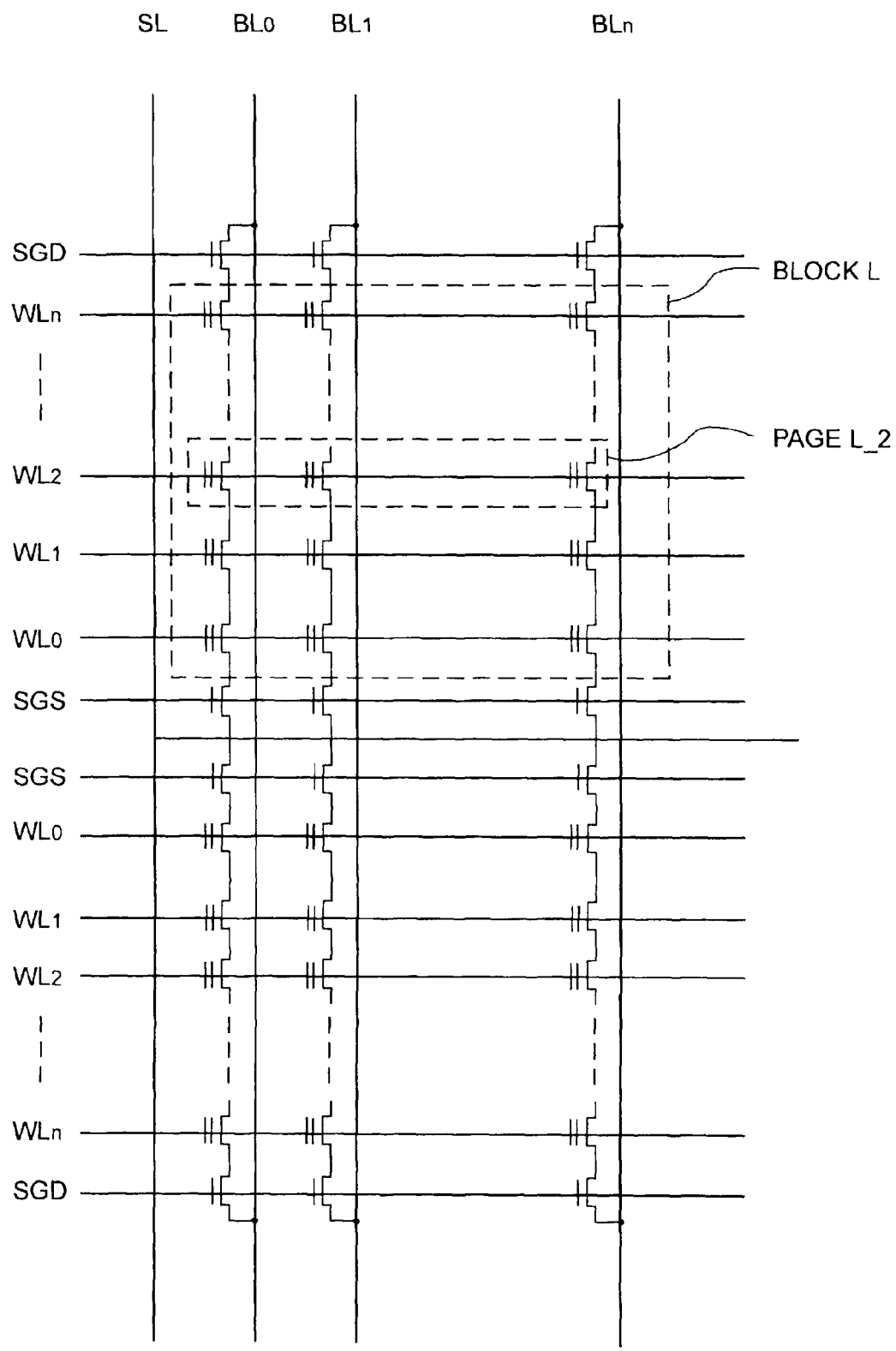
FIG. 2 is an equivalent circuit diagram of NAND cell units related to one embodiment of the present invention.

As a function block diagram of a nonvolatile semiconductor memory device related to the first embodiment of the present invention, FIG. 1 shows one example of a function block diagram of a memory chip which uses a NAND type flash memory. FIG. 2 is an equivalent circuit diagram of a plurality of NAND cell units of a memory cell array 21 in the case where the memory cells are memory cell transistors. As shown in FIG. 2, the memory cell array 21 is comprised of a plurality of NAND cell units arranged in an array. Each NAND cell unit includes a plurality of reprogrammable nonvolatile memory cells with two selection gate transistors arranged at both ends of the memory cells for connecting a source line SL and bit lines BL0-BLn respectively.

A control gate of a memory cell is connected to one of word lines WL0-WLm which are arranged intersecting the bit lines BL0-BLn. In addition, each control gate of the selection gate transistors is connected to a selection gate line, SGD or SGS, the both of which are arranged in parallel to these word lines.

A group of NAND cell units which share word lines form a block, which is an unit of data erasure operation. For example, in FIG. 2, two blocks are shown vertically in a bit line direction and the upper block is referred to as BLOCK L. Data programmed in the memory cells belonging to BLOCK L can be erased independently from other blocks.

In addition, a group of memory cells which are connected by the same word line are called a page as a unit of programming and reading data. In FIG. 2, the group of memory cells connected to the word line WL2 in BLOCK L are referred to as PAGE L_2.

Furthermore, a part of the memory cell array 21 may be used as a ROM fuse area. At the time of shipment of a nonvolatile semiconductor device, each parameter value is programmed in to the ROM fuse area and during normal use of a nonvolatile semiconductor device, the ROM fuse area is used as a region substantially equivalent to read-only ROM. Values of parameters such as Vpgm_init, which represents an initial program bias voltage, may be stored in the ROM fuse area.

Returning to FIG. 1, a row decoder 19 selects and drives a word line of the memory cell array 21.

A column decoder 24 selects a bit line. A sense amplifier circuit 22 is connected to a bit line of the memory cell array 21 and also connected to a data register 23, which temporarily stores input and output data.

At the time of a data read operation, the data which is read from the sense amplifier circuit 22 is output to external input/output terminals I/O1-I/O8 via an I/O control circuit 12.

At the time of a data program operation, data to be programmed, which have been supplied to the external input/output terminals I/O1-I/O8 from an external host device, is loaded into the sense amplifier circuit 22 via the data register 23.

Commands which are supplied from the external input/output terminals I/O1-I/O8 via the I/O control circuit 12 are decoded by a control circuit 17 via a command register 16. External control signals such as a chip enable signal/CE, a write enable signal /WE, a read enable signal /RE, an address latch enable signal ALE and a command latch enable signal CLE, are externally supplied to the I/O control circuit 112 and control circuit 17 via a logic controller circuit 13. The control circuit 17 performs the control of each sequence of operations of data program, erase, and read, based on external control signals and commands supplied according to an operation mode.

A status register 14 is a register for informing external devices of the various statuses of the chip 1. For example, there is a ready/busy register within the status register 14 which stores data which shows whether the chip 1 is in a ready status or a busy status, and a programming status register which stores data which shows a status of program pass or fail.

A voltage generation circuit 18 generates various voltages such as a program voltage Vpgm, a verify voltage Vverify, a program pass voltage VPass and a read voltage Vread, which are required by the memory cell array 21 and row decoder 19 according to the operation mode.

Figure 3:
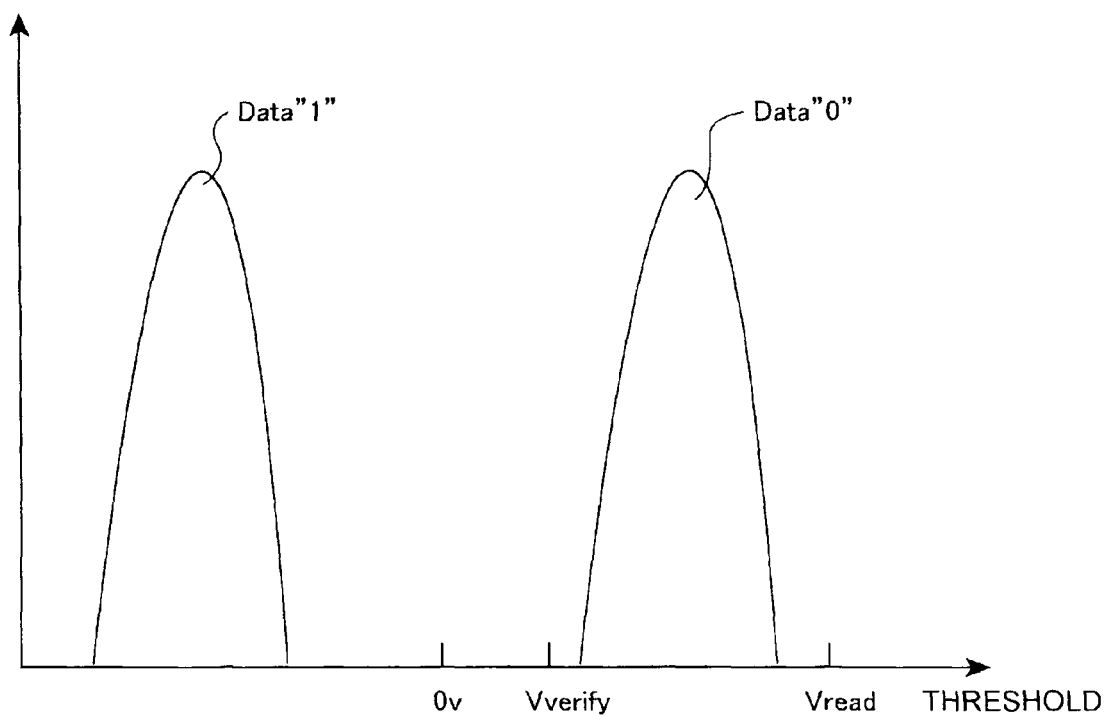
FIG. 3 is a preferred example diagram of a threshold distribution of a number of memory cells related to one embodiment of the present invention.

FIG. 3 shows a preferred example of the threshold distribution of the memory cells in the case where data with two values, "1" and "0," are programmed to each memory cell. In the case when data with these two values are programmed, it is theoretically possible to read the data programmed into a memory cell by detecting a threshold difference by whether a certain amount of charges is stored or not within a floating gate. However, actually, fluctuations in threshold voltages occur according to the characteristics of each individual memory cell. Consequently, when programming data, it is important to control this fluctuation and as is shown in FIG. 3, it is important to separate a group of memory cells programmed with "1" and a group of memory cells programmed with "0". In addition, the case where one memory cell is programmed with N pieces of data larger than two is also the same in that it is necessary to distinguish a memory cell which is programmed with each value of N pieces of data by the threshold values. Therefore, as is explained below, voltages applied to a word line are controlled when programming.

Figure 4:
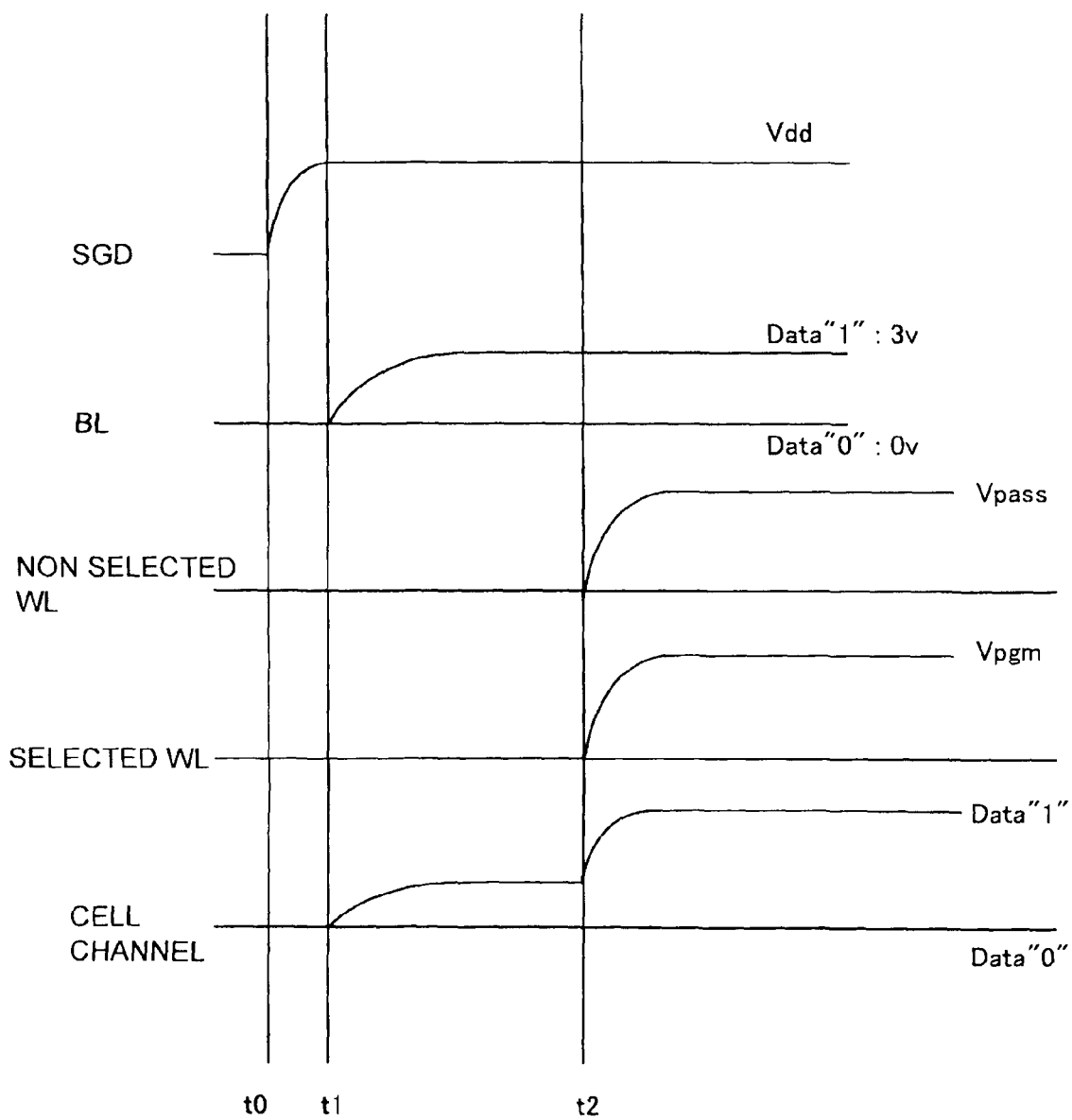
FIG. 4 is a timing chart of the control of a voltage when programming data to a memory cell related to one embodiment of the present invention.

FIG. 4 is a timing chart which explains an example of the control of voltages when programming data into the memory cells belonging to a page. In this control example, it is assumed that when data in a memory cell is erased the memory cell is in a state in which "1" is programmed. From the timing t0 a voltage of the selection gate line SGD, which selects a block of the page to which the programmed memory cell belongs, is raised, for example, to Vdd. Next, from the timing t1, a voltage of a bit line which is connected to a memory cell to be programmed with "0" is maintained at 0V. In addition, the application of a positive voltage of a bit line, which is connected to a memory cell to be programmed with "1", starts, for example, to rise to 3V, in order that "0" is not programmed. From the timing t2, a programming pass voltage Vpass is applied to the non-selected word lines which are word lines of other pages which are not programmed, thereby the memory cell transistor connected to one of the non-selected word lines turns into ON state, and a programming voltage Vpgm which is a higher voltage than Vpass, is applied to a selected word line, which is a word line of a page to be programmed.

By the control described above, the memory cells connected to a non-selected word line transmit the voltage applied via the bit lines. In addition, among the memory cells connected to the selected word line, the cell channel voltage of a memory cell which is to be programmed with "1" changes in accordance with the voltage of the selected word line, and any charge is substantially not injected into the floating gate of such memory cell. However, the cell channel voltage of a memory cell which is to be programmed with "0" is maintained at 0V and a charge is injected into the floating gate of such memory cell by the potential difference between the cell channel and the selected word line.

However, the amount of charges which are injected is different depending on the characteristics of a memory cell and even if the same voltage is applied, the thresholds of a memory cell to be programmed with "0" are not necessarily the same. Thus, each time the application of a programming voltage is finished, the threshold of the memory cell is verified, and only the threshold of the bit line which is connected to the memory cell which has an inappropriately low threshold which does not reach the voltage expressed as "0", is set at 0V, a stepped up program voltage is applied to the selected word line and control of the threshold is performed so that it reaches the threshold voltage representing "0".

Note that in the explanation so far, it is assumed that one bit data is programmed into one memory cell. However, the case in which multi bit data is programmed into one memory cell is explained similarly. That is, a range of threshold is sectioned into sections the number of which is represented by the multi bit data, stepped up voltages are applied to the selected word line until the threshold of the memory cell belongs to the section corresponding to the data to be programmed into the memory cell.

Figure 5:
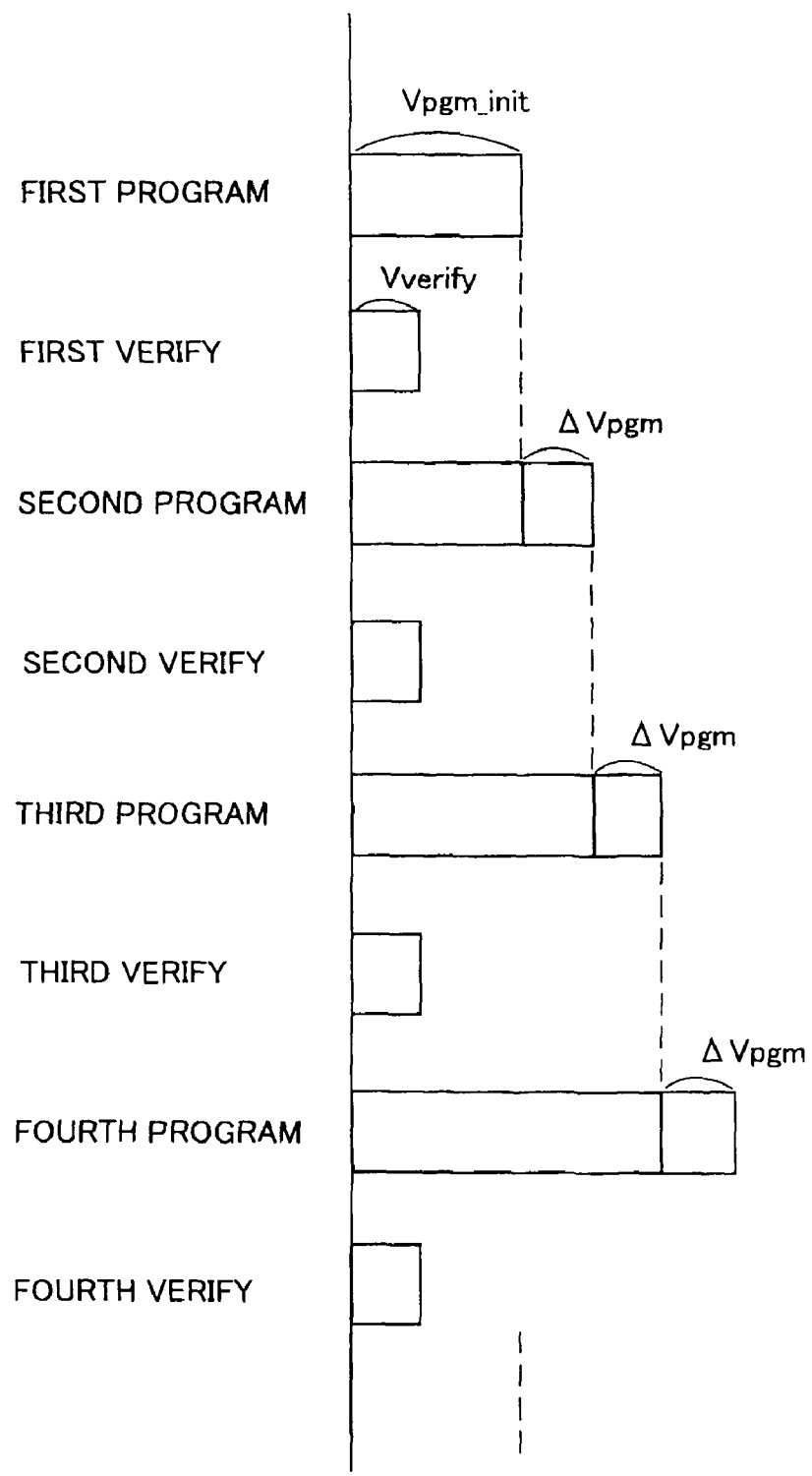
FIG. 5 is an example diagram of changes of the voltages applied to a selected word line related to one embodiment of the present invention.

FIG. 5 shows an example of a sequence of voltages applied to the selected word line in order to achieve the control described above. When the voltage is applied at the first time, the initial program bias voltage is applied to the selected word line. The value of the initial program bias voltage is represented by the value of the parameter Vpgm_init, which is set in the ROM fuse area of the memory cell array 21. Then, when the application of Vpgm_init is finished, in order to verify whether thresholds of all the memory cells in the page are appropriate, in other words, the threshold of each memory cell of the page corresponds to data to be programmed to each memory cell, Vverify is applied to the selected word line and Vpass is also applied to the non-selected word lines and data detection is performed by the sense amplifier circuit.

If a memory cell with an inappropriately low threshold exists in a page, at the second time of applying a program voltage a voltage is applied after adding ΔVpgm to the initial program bias voltage, which has been applied at the first voltage application. ΔVpgm is also a value of a parameter which is set in the ROM fuse area for example. Then, the verification is performed again. If a memory cell with an inappropriately low threshold exists as before, a voltage further added with ΔVpgm is applied to the selected word line as the next application voltage. Furthermore, a positive voltage of 3V for example, is applied to the bit line which is connected to the memory cell with an appropriate threshold, the selection transistor becomes an OFF state, and the memory cell is controlled so that data is not further programmed.

Figure 6:
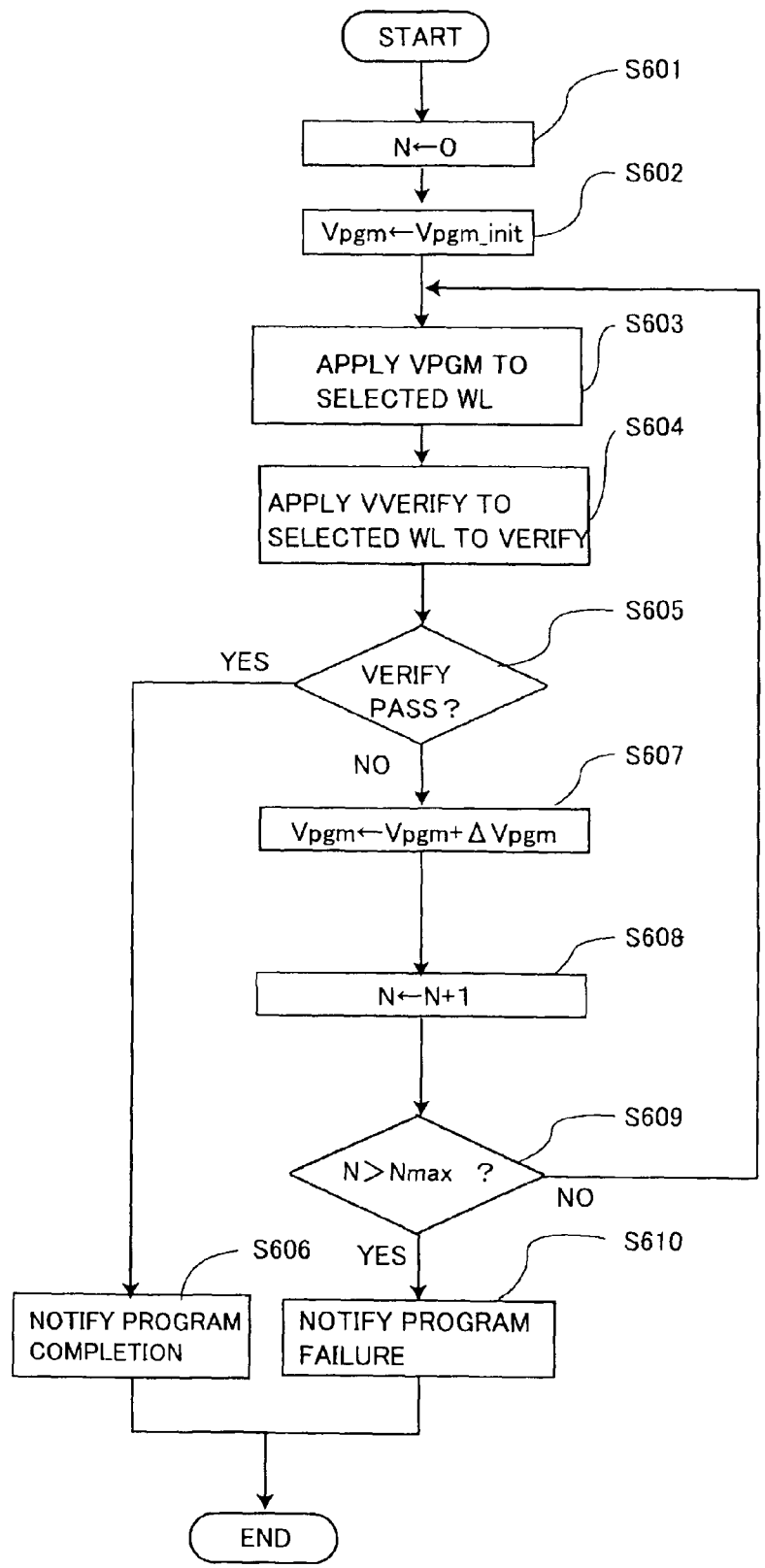
FIG. 6 is a flowchart of process for data programming and threshold verification related to one embodiment of the present invention.

FIG. 6 is a flowchart for processing the control explained above. In the step S601, a variable N for counting the number of applications of voltages is substituted for 0. N is generally realized by a register arranged within the control circuit of the chip. In the step S602, the value of the parameter Vpgm_init is substituted for the variable Vpgm, which represents the voltage to be applied.

In the step S603, a program voltage is applied to the selected word line according to the value of the variable Vpgm and data programming is performed. And in the step S604, the voltage Vverify is applied to the selected word line and the verification is performed. Furthermore, in the step S603, 0V is applied to the bit line which is connected to the memory cell which is to be programmed and a positive voltage, for example, 3V is applied to all the other bit lines.

In the step S605, a judgment is made as to whether a verification at the step S604 has succeeded or not, that is, whether the thresholds of all the memory cells of the page are appropriate. If the verification has succeeded, the process transfers to the step S606 and the external host device is notified that the programming operation is complete. If the verification has not succeeded, the process transfers to the step S607 and the value of the variable Vpgm is increased by ΔVpgm. Then, in the step S608, the value of the variable N is increased by 1 and in the step S609, a judgment is made as to whether the value of N exceeds a predetermined value Nmax. If Nmax is exceeded, the process transfers to the step S610 and a programming fail is notified. If it is not exceeded, the process returns to the step S603.

The process of programming data to a memory cell is as described above. When the value of the initial program bias voltage expressed by Vpgm_init is small, the number of loops formed by the processes from the step S603 to S609, increases and a longer time is required for programming. In addition, when the value of the initial program bias value is too large, the threshold may become too large and incorrect data may be programmed. Therefore, it is necessary to appropriately set the value of Vpgm_init and store the value in advance in the ROM fuse area for example.

In addition, in the case where data stored in all the memory cells of a certain block is to be erased, 0V is applied to a bit line and a word line, and a high voltage, for example VDD, is applied to SGD so that only the selection gate transistor of this block is switched ON. Then, similar to the case of programming, the erasure voltage determined by a parameter value stored in the ROM fuse area is applied to the well, and the thresholds of memory cells are verified to determine whether data stored in all the memory cells of the block have been erased. If there exists a memory cell in which data has not been erased, the voltage which is subsequently applied to the well is repeatedly stepped up by a predetermined value. Therefore, similarly, it is necessary to appropriately set in advance the value of a parameter to a predetermined high potential for erasing data. In this way, the voltage which is first applied to the well at the time of data erasure is also called an initial erasure bias voltage.

Figure 7:
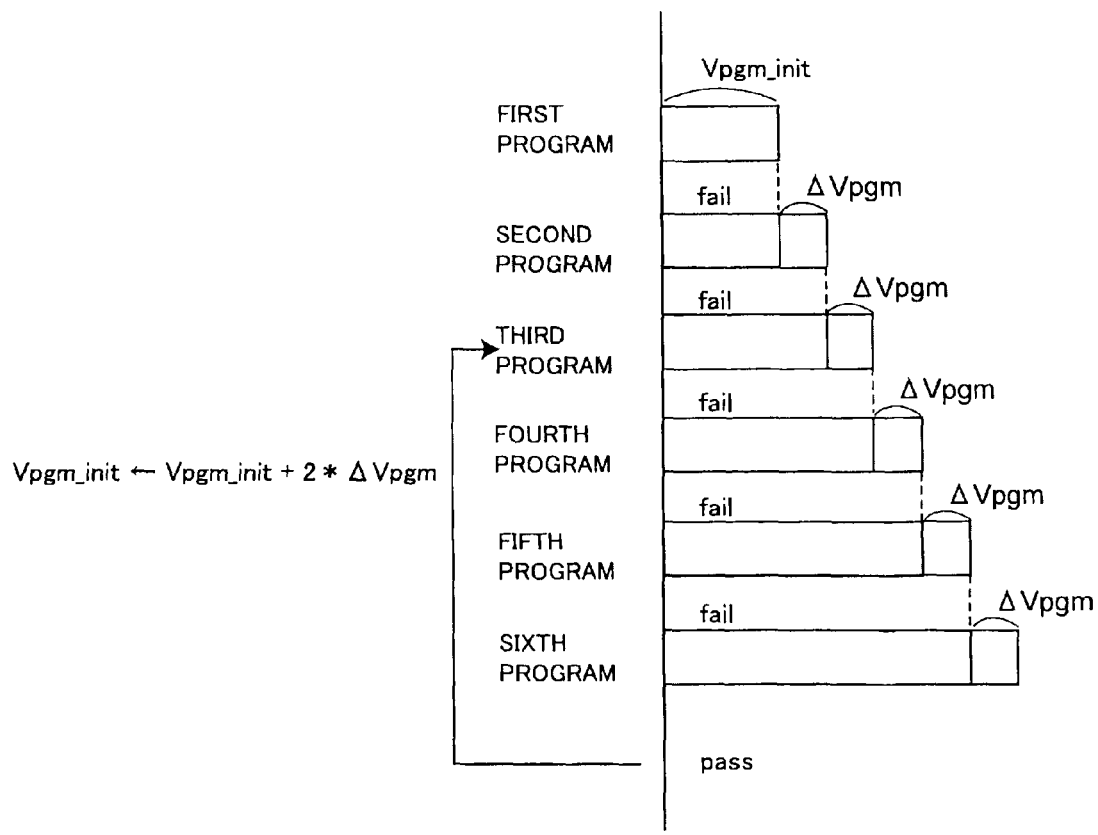
FIG. 7 is a diagram which explains trimming of an initial program bias voltage parameter Vpgm_init related to one embodiment of the present invention.

FIG. 7 exemplifies an outline of the first embodiment of the present invention. For example, four is assumed to be appropriate for the number of loops of the Vpgm application and the verification. Further when data programming or a data erasure operation is actually performed, a verification operation has succeeded after the sixth Vpgm application. Then, the value of Vpgm_init is rather lower and if the value of Vpgm_init represents a voltage larger by $2 \times \Delta Vpgm$, the number of loops is expected to have been four. This is also expected to hold for data erasure operation of a block. However, because a plurality of pages exist in the memory cell array 21, programming of a plurality of pages or average number of erasure loops is calculated in the first embodiment of the present invention and a value of Vpgm_init is set.

For example, the average number of applications of a voltage of data programming for a plurality of pages is calculated, and let n be a number of application times in which a desired number of application times is subtracted from the average, Vpgm_init may be set to represent the voltage at the n-th application. Similarly, the average number of applications of an erasure voltage for a plurality of blocks is calculated, and let m be a number of application times in which a desired number of application times is subtracted from the average. The value of a parameter of an initial erasure bias voltage may be set to represent the voltage at the m-th application.

In this way, the average number of applications of voltages for programming data or erasure is calculated, and setting the value of a parameter which represents an initial program/bias bias voltage when data is programmed or erased is hereinafter referred to as a trimming.

Figure 8:
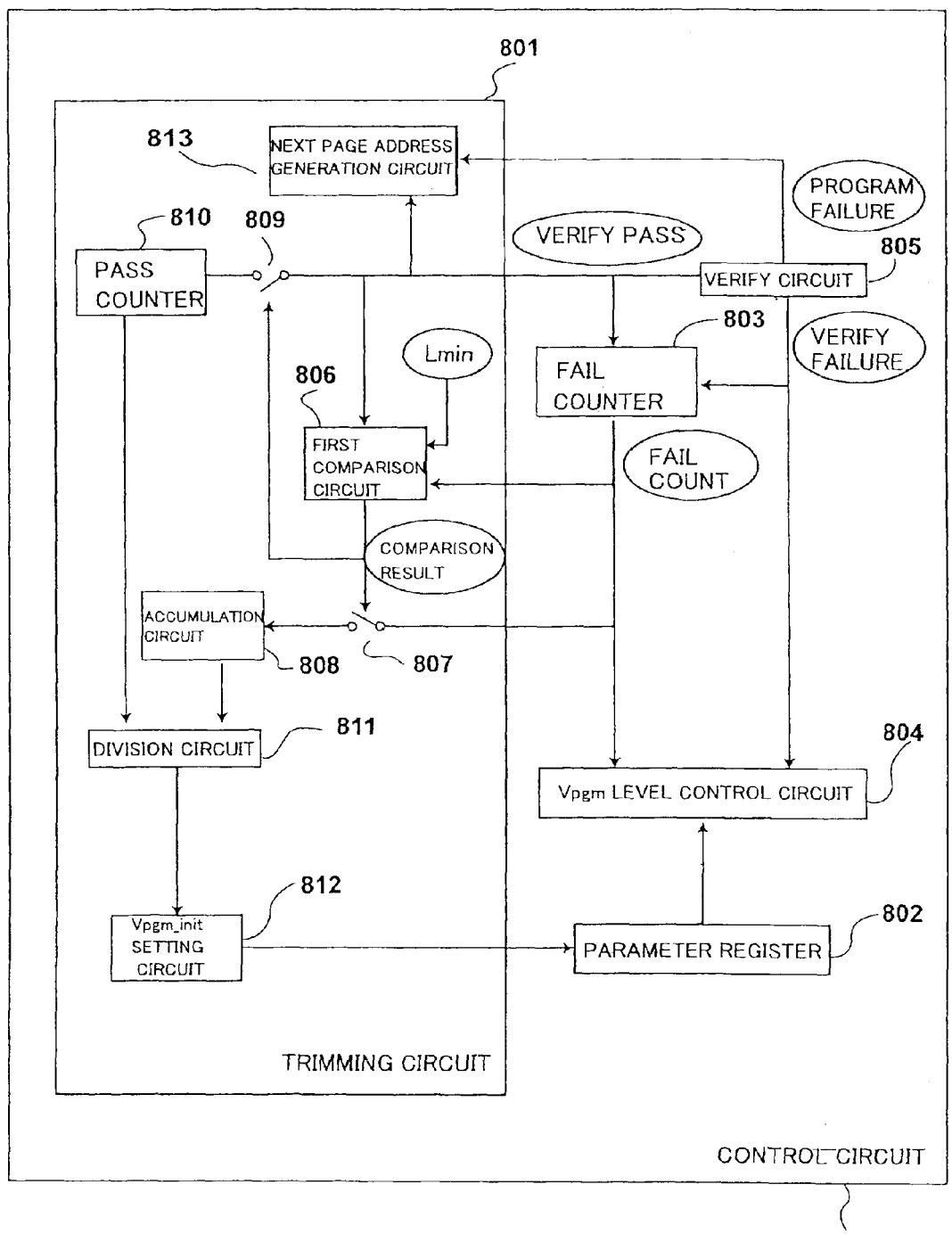
FIG. 8 is a structural diagram of a control circuit of a nonvolatile memory device related to one embodiment of the present invention.

FIG. 8 is function block diagram which shows the structure of the control circuit 17 of the nonvolatile memory device 1 related to the first embodiment of the present invention. In FIG. 8, the function block diagram of the part of the control circuit 17 which is related to a trimming operation of Vpgm_init, is shown.

The control circuit 17 includes a trimming circuit 801, a parameter register 802, a fail counter 803, a Vpgm level control circuit 804 and a verify circuit 805.

The trimming circuit 801 includes a first comparison circuit 806, a switch 807, an accumulation circuit 808, a switch 809, a pass counter 810, a division circuit 811, a Vpgm_init setting circuit 812, and a next page address generation circuit 813.

The parameter register 802 stores the values of the parameters such as Vpgm_init. Such parameters are used while the memory chip 1 is operating. Although the parameter register 802 is shown as being arranged within the control circuit 17 in FIG. 8, the parameter register 802 may actually be a part of the ROM fuse area of the memory cell array 21.

The fail counter 803 is a circuit which stores the number of verification operations after an initial program bias voltage is applied to a selected word line, in other words, the number of times the verification operation results in fail (hereinafter the number of times the verification operation results in fail is referred to as a fail count). When a verify fail signal is output from the verify circuit 805 as explained below, the fail counter 803 counts up 1 for the values stored, and when a verify pass signal is output, resets the stored values to 0. Furthermore, when the fail counter 803 resets to 1 instead of 0, the number of times a programming voltage is applied until a verification is successful is counted by the fail counter 803.

The Vpgm level control circuit 804 determines the value of a programming voltage which is applied to a selected word line and the voltage generation circuit 18 generates the voltage according to this value. For each page, at the first time of the voltage application, the Vpgm level control circuit 804 controls the voltage generation circuit 18 to generate a programming voltage according to a value of Vpgm_init stored in the parameter register 802. Following this, when a verify fail signal is output from the verify register 805, the fail count counted by the fail counter 803 is multiplied by $\Delta$ Vpgm before added to the value of Vpgm_init, and then the programming voltage according to the result is generated for each page.

The verify circuit 805 is a circuit which applies a Vverify voltage to a selected word line and performs a verification operation to check whether the thresholds of all the memory cells of the page to be programmed are appropriate or not. The verify circuit 805 outputs a verify fail signal when a verification operation results in fail, and a verify pass signal when a verification operation results in pass. In addition, when the number of verify operations exceeds a predetermined number (for example, Nmax shown in FIG. 6), a program fail signal is output.

The first comparison circuit 806 compares the fail count held in the fail counter 803 and the value of Lmin. Here, Lmin is a predetermined constant number which is stored, for example, in the parameter register 802 or is a parameter output from an external host device together with a trimming command for starting the trimming of Vpgm_init. As a result of a comparison, if the fail count is larger than Lmin the switch 807 and switch 809 are turned on and a fail count signal and a verify pass signal are each respectively transferred to the accumulation circuit 808 and the pass counter 810.

The accumulation circuit 808 accumulates the fail counts which are transferred from the fail counter 803. That is, the sum of the accumulated value stored internally and the transferred fail counts are accumulated as a new accumulated value. In addition, the accumulation circuit 808 outputs an accumulated value to the division circuit 811 explained below.

The pass counter 810 counts the number of times a verify pass signal is transferred from the verify circuit 805. In addition, the pass counter 810 outputs the result of the count (hereinafter referred to as the pass count) to the division circuit 811.

The division circuit 811 calculates the result of division of the value stored in the accumulation circuit by the pass count. The Vpgm_init setting circuit 812 sets the value of the parameter Vpgm_init based on the division result by the division circuit 811. From another view point, the division circuit 811 calculates the average value of the number of times a programming voltage is applied per a selected word line using the value counted by the pass counter 810 and the value accumulated by the accumulation circuit 808. Then, a predetermined count (for example, 4 in the case shown in FIG. 7) is subtracted from this average value, and a parameter value which represents the value of a programming voltage applied to a word line at the time corresponding to the value obtained, is set in the parameter register 802.

The division circuit 811 divides an accumulated value output from the accumulation circuit 808 by the result of a count output from the pass counter 810. Consequently, an average value of the fail count per a page is obtained. In addition, the division circuit 811 outputs the division result to the Vpgm_init setting circuit 812.

The Vpgm_init setting circuit 812 sets a value of Vpgm_init which is stored in the parameter register 802, using the division result output from the division circuit 811 and performs a final process of trimming. As is shown in FIG. 7, for example, the value obtained by subtracting a predetermined value from the division result output from the division circuit 811 is multiplied by $\Delta$ Vpgm, and a value which is added to the present value of Vpgm_init is set in the parameter register as a new Vpgm_init value.

When a signal which represents a verify pass or a program fail is output from the verify circuit 805, the next page address generation circuit 813 generates a page address which is to be programmed next for trimming. The address of the page is comprised of, for example, a block number or a block address and its word line number, which may be defined by the number of other word lines between itself and SGS or SGD of the same block. The generation of a page address is performed using a random number generated by a random number generator which is not shown in FIG. 8, and can be realized by sequentially generating an address within a predetermined range stored in the ROM fuse area. In the case where a random number is used, for example, the generated random number is divided by the number of blocks in the memory chip 1 and its remainder is made into a page address.

In another example, a page address may be input from an external I/O control circuit. When the next page address is required for the next program operation for trimming, the next page address generation circuit 813 begins to operate, making the control circuit 17 output a ready status via the read/busy status register, reading the data input via I/O1 to I/O16 being read as the next page address via the command register, for example.

Figure 9:
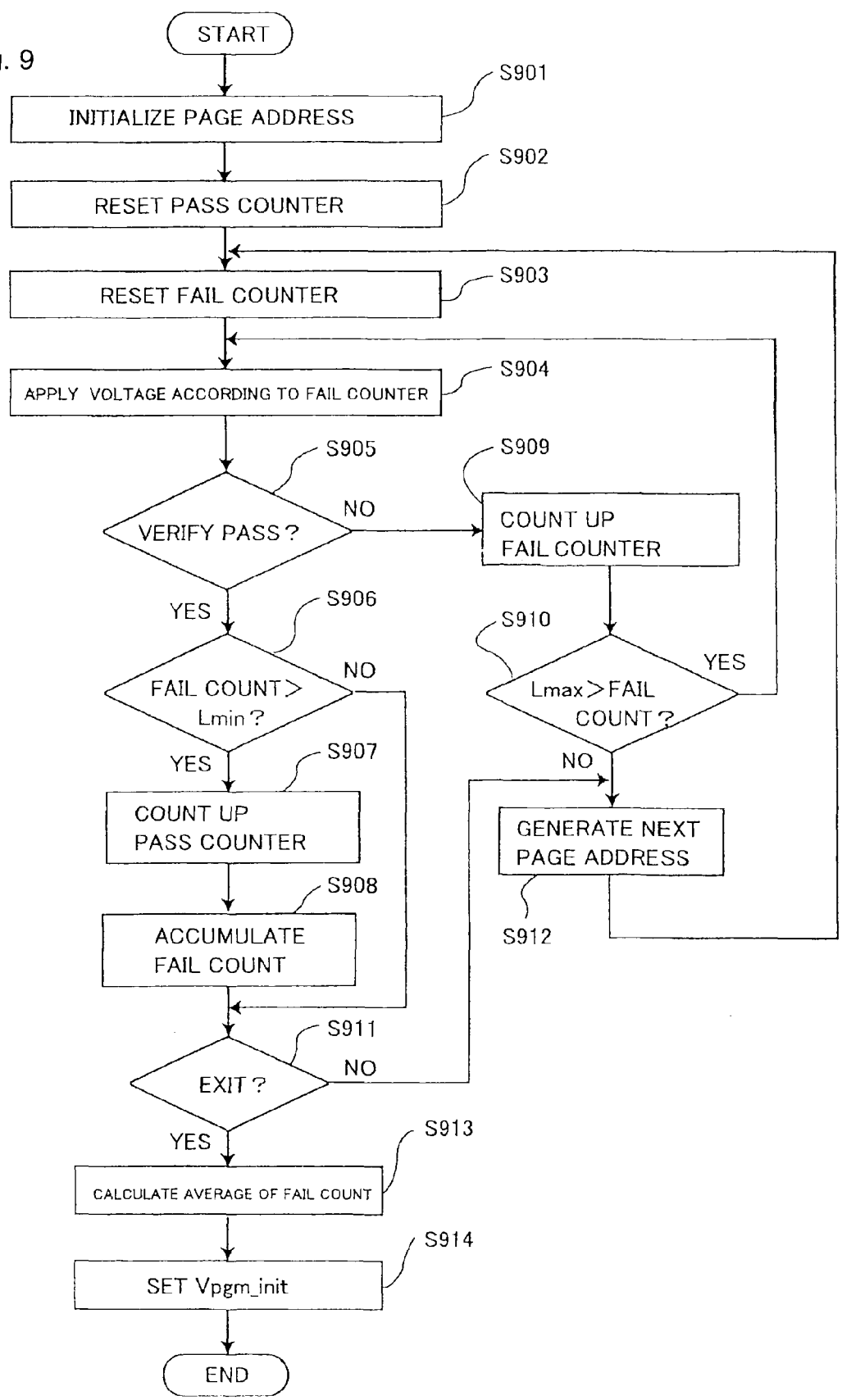
FIG. 9 is a flowchart of trimming an initial program bias voltage parameter Vpgm_init related to one embodiment of the present invention.

FIG. 9 shows an example of a flowchart of the process for setting a value of Vpgm_init in the nonvolatile semiconductor memory device related to the first embodiment of this invention. In the step S901, an initial setting of a page address is performed. That is, the page address which comprises the memory cells connected to a word line which is applied with the first programming voltage, is determined. This page address is set in the parameter register 802 for example, or is supplied from a test device connected to the chip 1. Then, in the step S902, the value stored in the pass counter 810 is reset to 0.

Then, in order to count the fail count in the current page, the value stored in the fail count counter 803 is reset to 0 in the step S903. In the step S904, the Vpgm level control circuit 804 is initiated and a program voltage is applied to the selected word line according to the fail count stored in the fail counter 803. When the process in the step S904 is first performed for the current page, a program voltage is applied according to the value of Vpgm_init.

When an application of the program voltage is finished, the verify circuit 805 is initiated and a verification operation is performed in the process in the step S905. If the verification operation is pass, the process shifts to the step S906 and if the verification is fail, the process shifts to the step S909

In the case where a verification operation result is pass in the step S905, a comparison of the value stored in the fail counter 803 and Lmin is performed by the first comparison circuit 806 in the step S906, and when the fail count is larger than Lmin the processes in the steps S907 and S908 are performed. In the case where Lmin is not smaller, the steps S907 and S908 are skipped.

In the process in the step S907, the values stored in the pass counter 810 are counted up and in the step S908 the values stored in the fail counter 803 are accumulated in the accumulation circuit 808.

In the case where a verification operation results in fail in the step S905, the value stored in the fail counter 803 is counted up in the step S909, and then in the step S910 Lmax is compared with the value stored in the fail counter 803 and if the fail count is smaller than Lmax, in order to step up the programming voltage and apply the programming voltage to the selected word line, the processing returns to the step S904. If Lmax is not large, because programming is fail, the process transfers to the step S912 in order to program and verify the next page.

After a verification operation results in pass in the step S905 and the processes in the steps S906 to S908 have been performed, it is determined whether the processes to all the pages which are to be programmed and verified are done for trimming Vpgm_init or not in the step S911, and if the processes are done, an average of the fail count is calculated and the process transfers to the step S914 in order to set a new Vpgm_init. The address of a page which should be programmed and verified is supplied from the external host, for example. If the processes to all the pages which are to be programmed and verified are not done, the process transfers to the step S912 in order to program and verify the next page.

In the step S912, the next page address generation circuit 813 is initiated in order to generate a page address which is to be programmed and verified next. If the next page address is generated, the process transfers to the step S903. The page address which is to be programmed and verified next may be determined by the external host stated above. In addition, if the page address which is to be programmed and verified next can not be generated for some reason, the process may shift to the step S913.

In the step S913, the division circuit 811 is initiated, the value stored in the accumulation circuit 808 is divided by the value stored in the pass counter 810 and the result is output to the Vpgm_init setting circuit 812. In the step S914, the Vpgm_init setting circuit 812 is initiated, a new Vpgm_init is set based on the value output by the division circuit 811 and trimming of the initial program bias voltage is complete.

While the trimming operation of an initial program bias voltage has been explained above, a trimming operation of parameters for an initial erasure bias voltage is similarly executed. That is, instead of counting the number of the verification failure by the fail counter 803 for each page as in the explanation above, the number of fails of data erasure for each block is counted. Then, the Vpgm level control circuit 804 controls the voltage which is applied to the well. The verify circuit 805 verifies whether the threshold of all memory cells in a block are within the range of or below the data erasure threshold. The next page address generation circuit 813 generates the next block address. In this way, it is possible to calculate an average value of a fail count for each block by the division circuit 811.

In the first embodiment of the present invention, because a nonvolatile semiconductor memory device includes a circuit which sets a parameter value which represents an initial program/erasure bias voltage, trimming can be performed of an initial program/erasure bias voltage according to the characteristics which are produced by variations during manufacture of each nonvolatile semiconductor memory device.

In addition, in the case where the fail count is below Lmin, the fail count of a page which exceeds Lmax is not used in the calculation of the average of the fail count and the setting of an initial program bias voltage is not affected by the pages in which the fail count exceeds Lmax. As a result, because the fail count of such pages in a bad block is ignored, it is no longer necessary to perform a conventional detection of a bad block and it is possible to reduce the time required for setting an initial program bias voltage by the time required for detecting a bad block.

Particularly, not requiring a detection of a bad block means that it is not necessary to consider the addresses of bad blocks differ chip by chip. That is, a plurality of memory chips can be connected to one device for trimming (for example, a test device), and it is possible to perform trimming a parameter by simultaneously providing page addresses for programming and block addresses for erasing for a plurality of memory chips.

ANOTHER EXAMPLE OF THE FIRST EMBODIMENT

Furthermore, as another example of the first embodiment of the present invention stated above, after the processes in the flowchart shown in FIG. 9 and are performed and the data in every block is erased, an average value of the fail counts is again calculated and it may be determined as to whether the average value of the fail counts belongs within a predetermined range.

Figure 10:
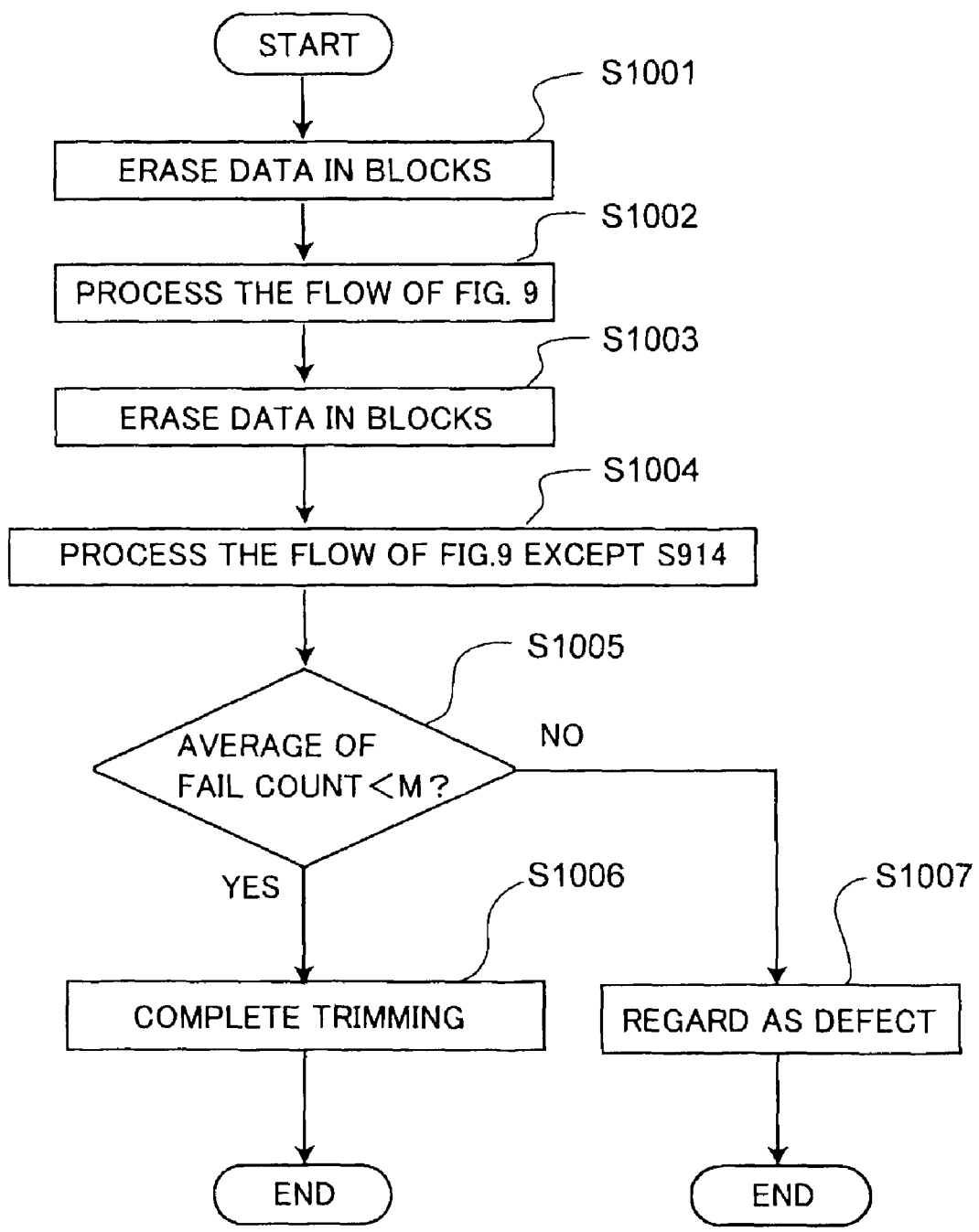
FIG. 10 is a flowchart of trimming of an initial program bias voltage parameter Vpgm_init related to one embodiment of the present invention.

That is, as is shown in the flowchart in FIG. 10, an erasure process is performed of the data stored in the memory cells in the blocks in the step S1001. Then, in the step S1002, the process shown in FIG. 9 is performed and trimming of an initial program bias voltage parameter is carried out. Then, in the step S1003, an erasure process is again performed of the data stored in the memory cells in the blocks. After this, in the step S1004, the processes other than the step S914 are performed in the flowchart of FIG. 9 and the average value of the fail counts is calculated.

In the case of trimming of data erasure, it is not necessary to perform the processes in the step S1001 and S1003.

Furthermore, in the steps S1002 and S1004, the pages and the blocks in which a program voltage is applied and a verify operation is performed do not have to be the same. For example, the number of pages or blocks in the step S1004 may be more or less than the number of pages or blocks in the step S1002.

Then, in the step S1005, it is determined whether the average value of the fail counts calculated in the step S1004 is smaller than a predetermined value M (for example, a parameter of a trimming command) and whether it is within in a predetermined range, and if this is true, the process transfers to the step S1006 and trimming of the initial program bias voltage parameter is complete. If this is not true, the process transfers to the step S1007 and the nonvolatile semiconductor memory device may be considered a defective product. Alternatively, the capability and price of the nonvolatile semiconductor memory device may be determined according to an average value of the fail counts calculated in the step S1004.

ANOTHER EXAMPLE OF THE FIRST EMBODIMENT

In the above example, the control circuit 17 may be constructed so that the value itself which is stored in the fail count counter 803 is accumulated by the accumulation circuit 811. As another example, a value in which a predetermined value has been subtracted from the value stored in the fail count counter 803 is accumulated in the accumulation circuit 811.

Figure 11:
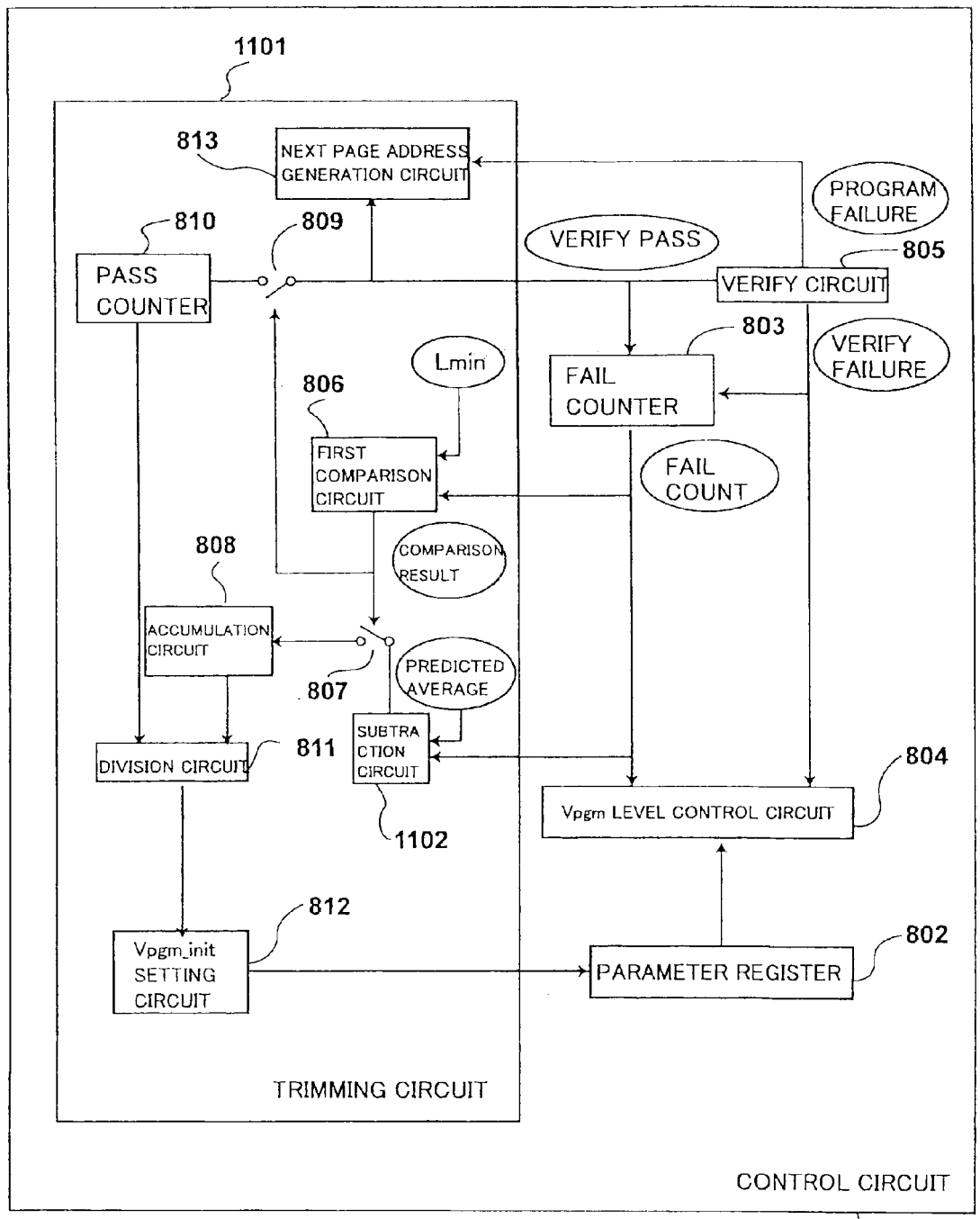
FIG. 11 is a structural diagram of a control circuit of a nonvolatile memory device related to one embodiment of the present invention.

FIG. 11 shows a function block diagram of the control circuit 17 in the construction described above. The differences between FIG. 11 and FIG. 8 are that the fail count output from the fail counter 803 is subtracted by a predetermined constant and output to the accumulation circuit 808 by the subtraction circuit 1102. The constant stated here is, for example, a predicted average value of a fail count which is calculated by the division circuit 811. Because the value is calculated after a predetermined constant is subtracted from the fail count, the division circuit 811 adds this predetermined constant after performing a division.

In FIG. 11, the subtraction circuit 1102 is arranged between the fail counter 803 and the switch 807. Alternatively it may be arranged between the switch 807 and the accumulation circuit 808.

Because the value is calculated after a predetermined constant is subtracted from the fail count, if the predetermined count is the same or a value close to the average value of the predicted fail count which is calculated by the division circuit 811, then a numerical value close to 0 is accumulated by the accumulation circuit 808. As a result, it is possible to reduce the number of bits of a register which comprises the accumulation circuit 808 and also reduce circuit size. In addition, it is also possible to reduce the circuit size of the division circuit 811.

ANOTHER EXAMPLE OF THE FIRST EMBODIMENT

Figure 12:
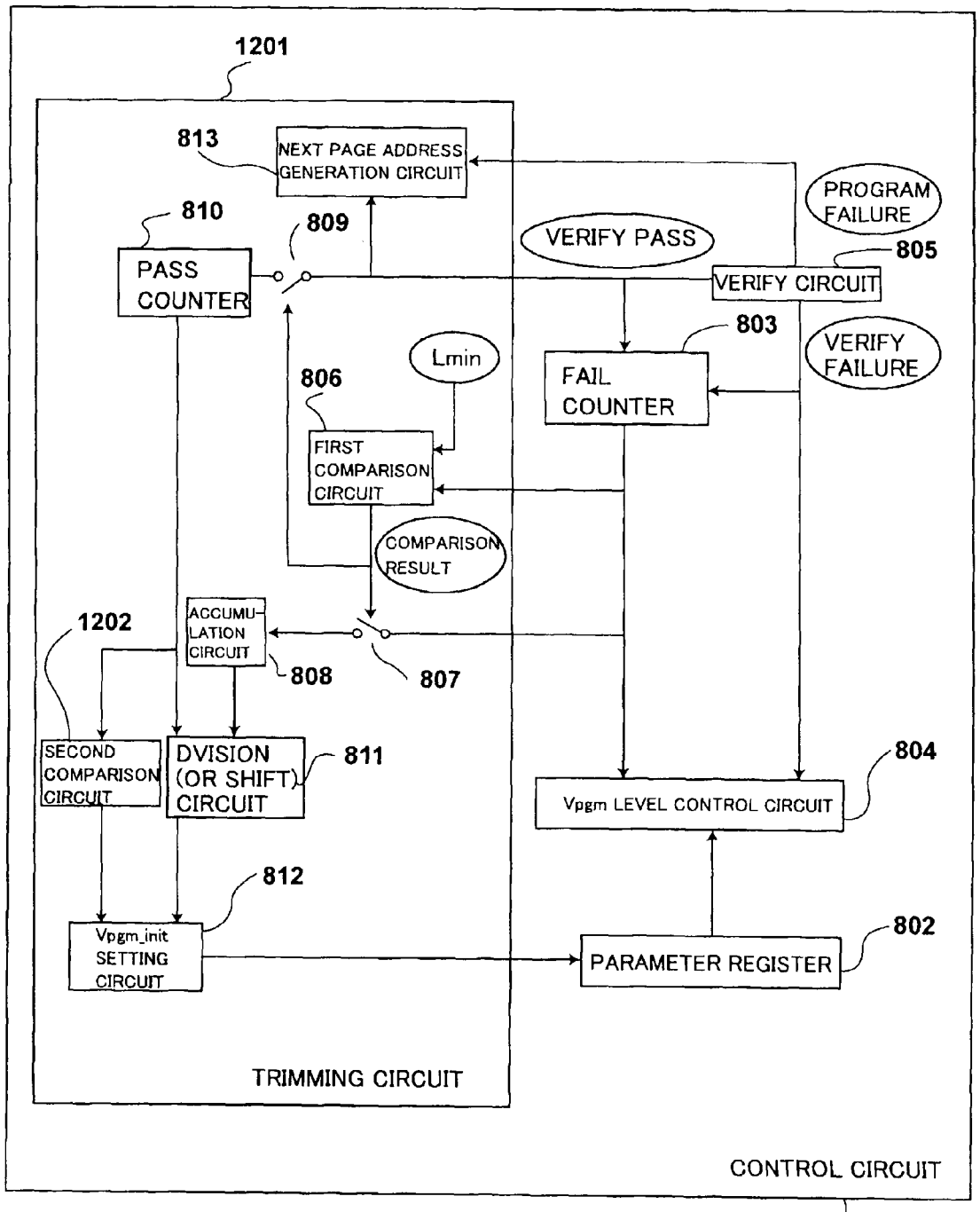
FIG. 12 is a structural diagram of a control circuit of a nonvolatile memory device related to one embodiment of the present invention.

As another example of the first embodiment of the present invention described above, the division circuit can be realized as a bit shift operation circuit. FIG. 12 shows the division circuit 811 of the function block diagram shown in FIG. 8 realized as a bit shift circuit. In addition, a second comparison circuit 1202 is further arranged and the pass count counter 810 also outputs a count result to the second comparison circuit 1202.

The second comparison circuit 1202 compares whether the result of a count output by the pass counter 810 is a power of two. In addition, the second comparison circuit 1202 may also output a logarithm of two of the count result to the shift circuit 811. In this case, it is not necessary to express the logarithm of two as a floating point number or a fixed point number. The logarithm of two can be a whole number part of the logarithm of two. In addition, the logarithm of two can be can be a number in which 1 is subtracted from the number of digit places in the case where the value stored in the pass count counter 810 is shown as binary digit. Then the division circuit 811 shifts to the right the bit value accumulated in accumulation circuits by the value input from the pass counter 810.

Figure 13:
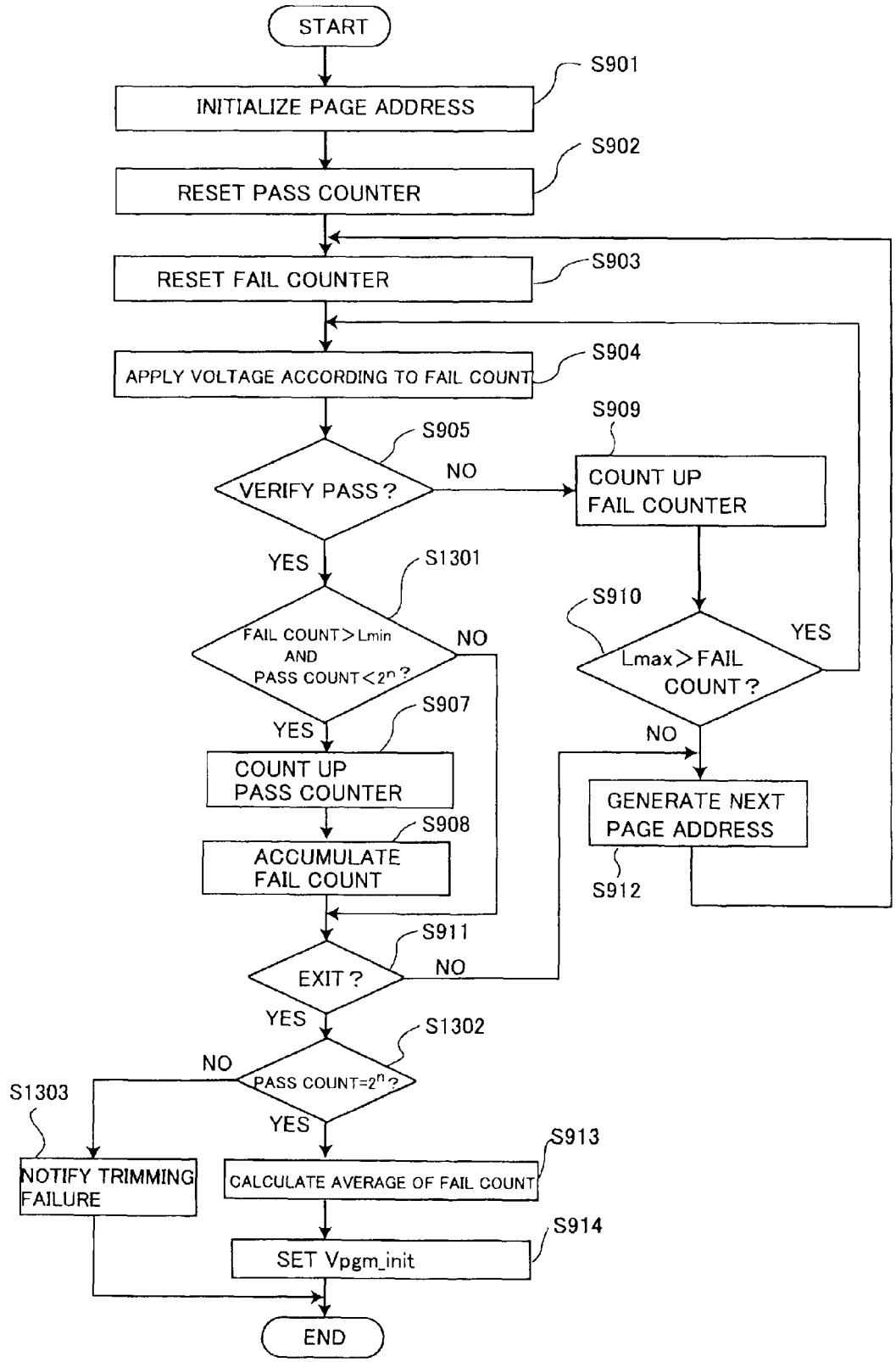
FIG. 13 is a flowchart of trimming of an initial program bias voltage parameter Vpgm_init related to one embodiment of the present invention.

FIG. 13 shows an example of a flowchart which explains the process flow in trimming Vpgm_init in the current example. When compared to the flowchart in FIG. 9, the process in the step S906 in FIG. 9, in FIG. 13, in the step S1301, the fail count is large than Lmin and the value stored in the pass count counter 810 is checked whether it is below $2^n$. In this way, it is possible to count up a pass count and accumulate a fail count in a page which is presumed not to be a bad block. In addition, it is also possible to prevent a pass count determined in the step S1302 from exceeding $2^n$. In addition, in the step S911 when the processes to all the pages which should be programmed and verified in order to trim Vpgm_init, are judged to be finished, the value stored in the pass counter 810 is judged whether it is equal to $2^n$ in the step S1302. If this is true, because it is possible to perform a division calculation by a bit shift operation, the processes in the step S S913 and S914 are carried out. In addition, if the value stored in the pass counter 810 is not equal to $2^n$, a trimming fail notification operation is performed in the step S1303.

Furthermore, in the flowchart in FIG. 13, the processes in the steps S911, S1302 and S1303 can be amalgamated, whether the value in the pass counter 810 is $2^n$ is checked and if it is $2^n$ more than a predetermined value (for example, more than 256), the process can transfer to S913. Furthermore, if the number of pages in which programming and verification have not yet been performed is added to the pass counter 810 and the value does not exceed a predetermined value more than $2^n$, a trimming fail notification operation can be performed.

Furthermore, in the description so far, a plurality of circuits arranged with calculation functions such as the fail counter 803, the first comparison circuit 806, the accumulation circuit 808, the pass counter 810 and the division circuit 811, are arranged in the function block diagram of the trimming circuit. However, in the first embodiment of the present invention, it is not essential to arrange a plurality of circuits including these types of calculation functions. For example, it is possible to realize these functions in one operation circuit.

Figure 14:
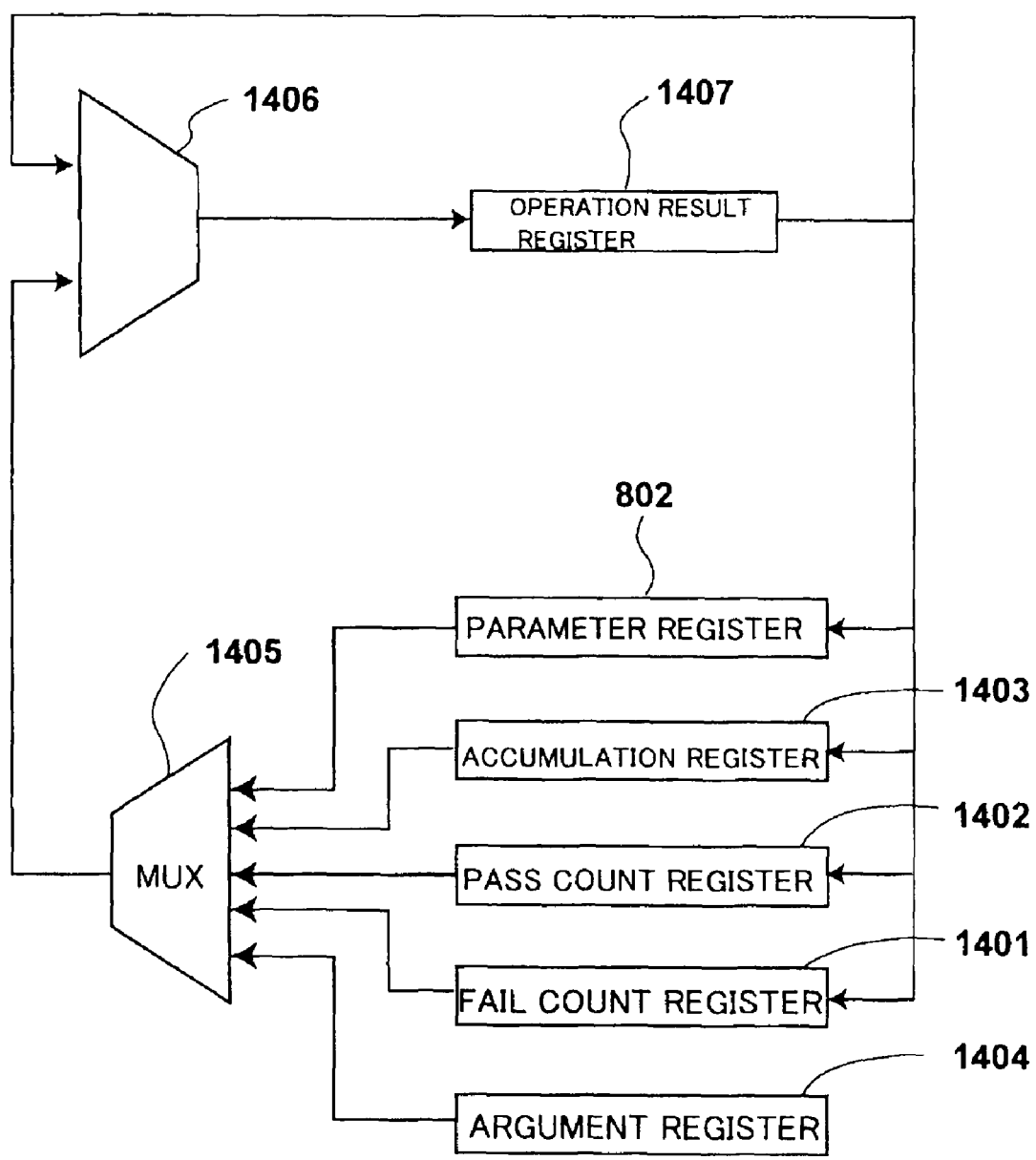
FIG. 14 is a structural diagram of a control circuit of a nonvolatile memory device related to one embodiment of the present invention.

FIG. 14 is a schematic diagram of a trimming operation circuit which realizes the same functions as the first comparison circuit 806, the accumulation circuit 808, the pass counter 810 and the division circuit 811 in one operation circuit. The trimming operation circuit 1400 includes a fail count register 1401, a pass count register 1402, an accumulation register 1403, an argument register 1404, a multiplexer 1405, a calculation circuit 1406 and an operation result register 1407. In addition, the parameter register 802 is connected with the multiplexer 1405 and the operation result register 1407.

The fail count register 1401 is a register used for storing the fail count. The fail count register 1401 has the functions of the fail counter 813 but it must not have the count up function.

The pass count register 1402 is a register used for storing the pass count. The pass count register 1402 has the functions of the pass counter 810 but it must not have the count up function.

The accumulation register 1403 is a register used for storing the accumulated value of the fail count. The accumulation register 1403 has the functions of the accumulation circuit 808 but it must not have the accumulation operation function.

The argument register 1404 is a register used for storing numeric values (command argument etc) input along with a command which initiates a trimming operation. For example, Lmin and Lmax may be stored in the argument register 1404.

The multiplexer 1405 selects one value from the values stored in the parameter register 802, the fail count register 1401, the pass count register 1402, the accumulation register 1403 and the argument register 1404 and outputs to the operation circuit 1406.

The calculation circuit 1406 performs a calculation operation using a value output from the multiplexer 1405 and a value output from the operation result register 1407, and outputs to the operation result register 1407. The operations performed in the calculation circuit 1406 include generating a constant 0, outputting unchanged whichever value is input to the calculation circuit 1406, adding 1 to whichever value is input to the calculation circuit 1406, calculating the sum of, difference between and the quotient of two values input to the operation circuit 1406, and a comparison operation.

For resetting the fail count register 1401, the pass count register 1402 and the accumulation register 1403 to 0, 0 is generated in the calculation circuit 1406 and stored in the operation result register 1407, and the value stored in the operation result register 1407 is imported into one of either the fail count register 1401, the pass count register 1402 or the accumulation register 1403.

In addition, in order to count up the values stored in the fail count register 1401 and the pass count register 1402, the multiplexer 1405 selects a value from either the fail count register 1401 or the pass count register 1402, 1 is added to the operation circuit 1406, and stored in the operation result register 1407 and this value is imported/output to the fail count register 1401 and the pass count register 1402.

In accumulating the fail count, the multiplexer 1405 selects the accumulation register 1403, the value stored in the accumulation register 1403 is output and stored in the operation result register 1407 via the calculation circuit 1406. Next, the multiplexer 1405 selects the fail count register 1401, calculates the sum of the value stored in the operation result register 1407 by the calculation circuit 1406, and the value in the fail count register 1401 and stores this sum in the operation result register 1407. Then, the value stored in the operation result register 1407 is stored in the accumulation register 1403.

Similarly, in the case where a value which represents an initial program bias voltage such as the new value of Vpgm_init, is calculated and stored in the operation result register 1407, this value is stored in the parameter register 802.

For timing of the operations in the fail count register 1401, the pass count register 1402, the accumulation register 1403, the argument register 1404, the multiplexer 1405, the operation circuit 1406, the operation result register 1407, and the parameter register 802, a sequence of signals generated by a limited state automaton or sequencer not shown in the diagram is used so that the processes in the flowchart shown in FIG. 9 are realized and output to the fail count register 1401 for example.

Second Embodiment

In the second embodiment of the present invention a construction is explained in which trimming of Vpgm_init is performed according to the position of a word line. As the position of a word line, it can be considered to be a physical position of the word line within the memory cell array 21 and a position within a block to which the word line belongs. The former position may be regarded as an absolute position while the latter position may be regarded as a relative position. The former position can be expressed by the position where the word line is located within the memory cell array 21 and the latter position can be expressed by the number of word lines that exist between SGS within the same block.

There are cases when the characteristics of programming to a memory cell depend and change on the position of a word line. The fluctuations in the manufacturing process can be given as one reason for such dependency and/or change in characteristics. Differences in the rate of etching according to the position of word line in the memory cell array 21 and also fluctuations which are difficult to avoid due to processing qualities. As an example of this, because of the properties of the side wall processing, fluctuations occur due to where the number of word lines which exist between the SGS in the same block are even or odd.

Figure 15:
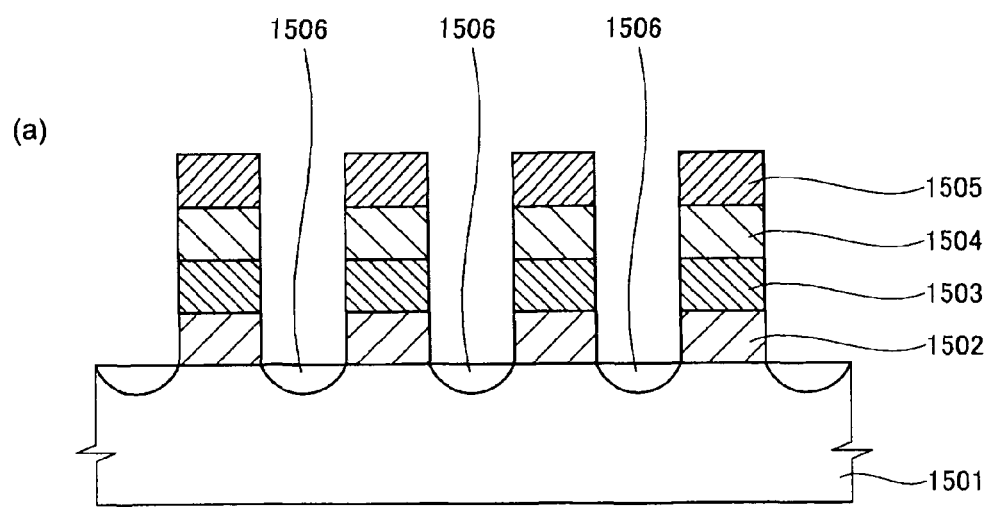
FIG. 15 is a sectional diagram of a part of a NAND cell unit.
Figure 15:
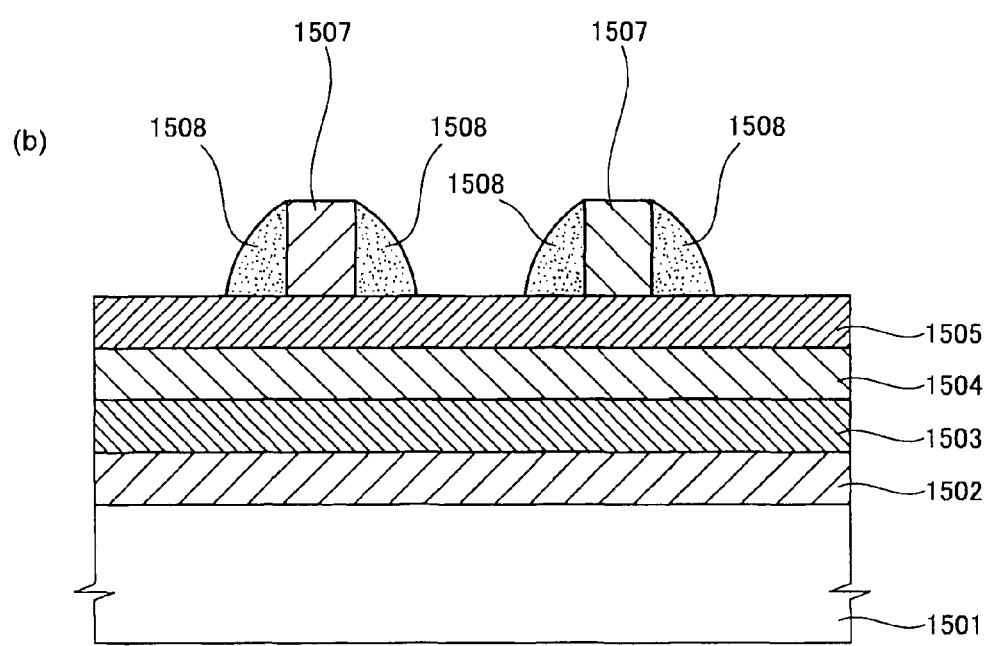

FIG. 15 (*a*) is a diagram which shows a cross sectional structure of a memory cell in a direction of the arrangement of the memory cells of a NAND cell unit. FIG. 15 (*b*) is a diagram which explains a side wall processing process for obtaining the structure in FIG. 15 (*a*). As is shown in FIG. 15 (*a*), the memory cell has a structure in which a first insulation layer 1502, a floating gate (or a charge storage layer) 1503, a second insulation layer 1504 and a control gate 1505 are sequentially stacked on a substrate 1501. A diffusion region 1506 is formed on the surface part of the substrate between the memory cells and connects the memory cells in series. In addition, the control gate 1505 forms a word line which extends in a perpendicular direction to the diagram.

In order to obtain the structure in FIG. 15 (*a*), a material of the first insulation layer 1502, a material of the floating gate (or charge storage layer) 1503, a material of the second insulation layer 1504, and a material of the control gate 1505 are sequentially stacked on the substrate 1501. Then, a first sacrificial layer 1507 is stacked on the material of the control gate 1505 and formed into a word line and a plurality of parallel straight lines by photolithography. In addition, the first sacrificial layer 1507 is not formed between every pair of word lines as is shown in FIG. 15 (*b*), but between every other pair of word lines. That is, in the case where word lines are lined as WL2, WL3, WL4, WL5 in this order, the first sacrificial layer 1507 is formed between word lines WL2 and WL3 and between word lines WL4 and WL5 and not between word lines WL3 and WL4. In addition, a slimming process may be performed on the first sacrificial layer 1507 according to necessity.

After forming the first sacrificial layer 1507, a second sacrificial layer 1508 is formed on a side wall of the first sacrificial layer 1507. First, the second sacrificial layer 1508 is filled between the first sacrificial layers 1507, and etching is performed on the second sacrificial layers 1508 between adjacent first sacrificial layers 1507 so that only the side wall sections of the first sacrificial layers 1507 remain. Then, the first sacrificial layer 1507 is removed and the second sacrificial layer 1508 is etched as a mask. After performing the side wall processing in this way, the diffusion region 1506 is formed and the structure in FIG. 15 (*a*) is obtained.

By performing the side wall processing it is possible to obtain a detailed structure in which the resolution limits of an exposure process are overcome. For example, it is possible to make the width of the second sacrificial layer smaller. However, difficulties arise in equalizing the distances between the adjacent second sacrificial layers which are formed on the side walls of the first sacrificial layers. Thus, the distance between adjacent memory cells in a direction in which the memory cells are lined periodically changes. A change in the distance between adjacent memory cells means a change in the length of the diffusion region etc. and as a result, the characteristics of programming a memory cell change depending on where the number of word lines that exist between SGS is even or odd.

Thus, it is preferred that an initial program bias voltage be trimmed depending on where the number of word lines that exist between SGS is even or odd. Below, a word line such that there are even number of other word lines in the same block between itself and SGS is called an even word line, and a word line such that there are odd number of other word lines in the same block between itself and SGS is called an odd word line. Trimming of a parameter of an initial program bias voltage to an even word line and a parameter of an initial program bias voltage to an odd word line is explained as follows. That is, two accumulation circuits 808 are arranged in the trimming circuit 801 shown in FIG. 8, FIG. 11, and FIG. 12. One accumulation circuit 808 is used for the accumulation of a fail count when programming a page of an even word line and the other accumulation circuit 808 is used for the accumulation of a fail count when programming a page of an odd word line. In addition, when trimming is performed, in order to count the pass count in the pages of even word lines and the pass count in pages of odd word lines, two pass counters 810 are also arranged.

In the case where trimming is performed according to the flowchart in FIG. 9 or FIG. 13, the process of the step S908, two pass counters and two accumulation circuits are selected depending on whether the word line of a page which is programmed is an even word line or an odd word line. In the step S913, an average of the fail counts in pages of even word lines using the count counted by the pass counters which count the pass count of pages of even word lines is calculated. In addition, an average of the fail count in pages of odd word lines using the count counted by the pass counter which counts the pass count of pages of even word lines is calculated. In the step S914, the parameter Vpgm_init of an initial program bias voltage for pages of even word lines and the parameter Vpgm_init of an initial program bias voltage for pages of odd word lines are set.

Figure 16:
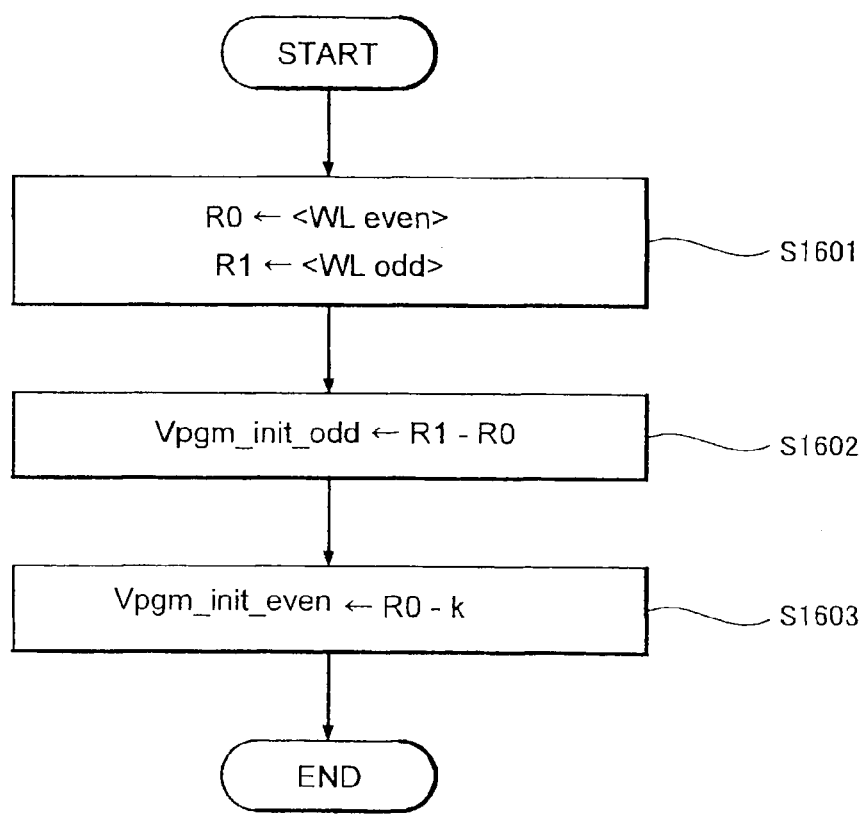
FIG. 16 is a flowchart of trimming of an initial program bias voltage parameter Vpgm_init related one embodiment of the present invention.

FIG. 16 shows the flowchart describing FIG. 9 and FIG. 13 from another view point. In the flowchart in FIG. 16, the value of the parameter of an initial program bias voltage for pages of odd word lines is set by the difference from the value of the parameter for initial program bias voltages for pages of even word lines. In the step S1601, the average of the fail count in pages of even word lines (written as <WLeven>) is substituted for a register R0, and the average of the fail count in pages of odd word lines (written as <WLodd>) is substituted for a register R1. In the step S1602, a value corresponding to R1–R0 which is the difference between R1 and R0 is set to the parameter Vpgm_init odd of an initial program bias voltage of pages of odd word lines. In the step S1603, a value corresponding to R0–k is set to Vpgm_init_even. Here, the value of k represents a desired value among the number of times program voltages are applied in the case where programming is performed to one page. The value corresponding to R0–k means the value which represents a voltage applied at the (R0–k)-th time before Vpgm_init_even is set.

Furthermore, only one pass counter and one accumulation circuit are prepared and programming may be performed to only pages of even word lines as a first step and <WLeven> is calculated and stored in R0, and as the next step, <WLodd> may be calculated only for pages of odd word lines and may be stored in R1.

In this way, by setting a parameter of an initial program bias voltage of even word lines and an initial program bias voltage of odd word lines, it is possible to control the differences in programming characteristics which arise on even word lines and odd word lines due to the side wall processing. In addition, as stated above, by setting a difference of the parameter value of an initial program bias voltage of an even word line and the parameter value of an initial program bias voltage of an odd word line it is possible to reduce the number of bits which store a parameter value.

Third Embodiment

As the third embodiment of the present invention, a trimming of Vpgm_init is explained in which the trimming is performed according to positions of word lines. Generally, a memory cell which is adjacent to or close to a selection gate transistor has a tendency to have a different threshold to a memory cell which is not adjacent to a selection gate transistor and arranged close to a selection transistor, due to the effects of Gate Induced Drain Leakage (GIDL). As a result, it is preferred that trimming of the value of Vpgm_init is performed separately for memory cells which are arranged in a position near a selection gate transistor and other memory cells which are not. In the present embodiment, the trimming operation of Vpgm_init is explained according to the closeness of a selection gate transistor, that is, according to positions of word lines.

Figure 17:
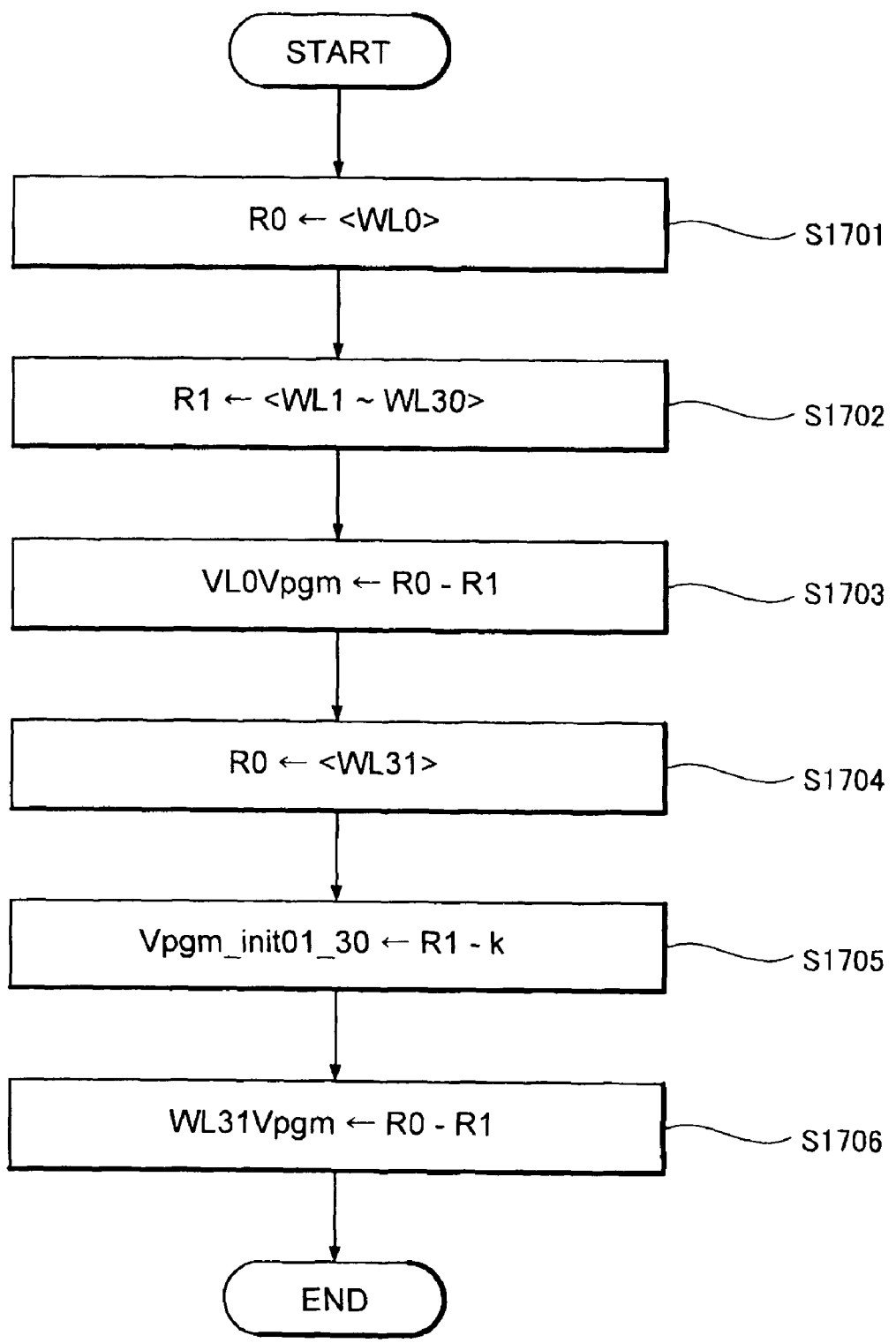
FIG. 17 is a flowchart of trimming of an initial program bias voltage parameter Vpgm_init related one embodiment of the present invention.

FIG. 17 shows an example of a flowchart which explains the process related to the third embodiment of this invention. In this flowchart, it is assumed that there are thirty-two word lines WL0 to WL31 for each block, and a process is shown in which three Vpgm_init are separately set for word lines WL0 and WL31, which are connected to the memory cells adjacent to a selection transistor, and word lines WL1 to WL30, which are connected to memory cells not adjacent to any selection transistor.

In the present embodiment, it is assumed that the Vpgm_init setting circuit 812 of the trimming circuit exemplary shown in FIG. 8, FIG. 11 and FIG. 12, includes R0, R1 and R2 as registers for temporarily storing the values of Vpgm_init which should be set in the parameter register 802.

In the step S1701, all the processes in the flowchart shown in FIG. 9 or FIG. 13 apart from the step S914 are performed for the word line WL0 in each block, an average value of a fail count is calculated and stored in the result register R0. In FIG. 17, the average value of a fail count calculated for WL0 is represented by <WL0>, At this point, the result of trimming Vpgm_init based on the result stored in R0 is not set in the parameter register 802. This is because the value of Vpgm_init of the word line WL0 is stored as the difference from the value of Vpgm_init of the word lines WL0 to WL31 and unless Vpgm_init of the word lines WL0 to WL31 are not determined, incorrect calculations for the voltage applications are likely to occur.

For example, assume that the parameters which represent the initial program bias voltages of the word lines WL0, WL1 to WL30, and WL31 are each given as Vpgm_init0, Vpgm_init01_30, and Vpgm_init31, and in addition to this, there are dependencies between Vpgm_init0, Vpgm_init01_30, and Vpgm_init31 as follows:

$Vpgm\_init0=Vpgm\_init01\_30+WL0Vpgm$, and $Vpgm\_init31=Vpgm\_init01\_30+WL31Vpgm$ Since there is a dependency between Vpgm_init0 and Vpgm_init01_30, unless Vpgm init01_30 of the word lines WL0 to WL30 are not determined, trimming of Vpgn_init0 of the word line WL0 can not be performed correctly.

Next, in the step S1702, all the processes in the flowchart shown in FIG. 9 or FIG. 13 apart from the step S914, are performed for the word lines WL1 to WL30 in each block, an average value of a fail count is calculated and result is stored in the register R1. In FIG. 17, the average value of a fail count calculated here is shown as <WL1~WL30>.

In the step S1703, trimming is performed on Vpgm_init of the word line WL0 from the value stored in R0 and R1. That is the value corresponding to R0−R1 is set for WL0Vpgm. For example, R0 is given as 5, and R1 is 6, and if a preferred voltage application count is 4, the word line WL0 is compared with the present Vpgm_init and the initial program bias voltage is increased by Δ Vpgm and by (5−4)×Vpgm for the word lines WL1 to WL30. Therefore, −1 is set in the parameter register 802 as a value of the parameter WL0Vpgm which shows the difference between the initial program bias voltage of the word line WL0 and the initial program bias voltage of the word lines WL1 to WL30. That is WL0Vpgm is set so that the initial program bias voltage for WL0 decreases by Δ Vpgm.

At this point, Vpgm_init of the word lines WL1 to WL30 are still not set in the parameter register 802. This is because it is still necessary to calculate the average value of the fail count for the word line WL31.

In the step S1704, all the processes in the flowchart of FIG. 9 apart from the step S914 are performed for the word line WL31 of each block and an average value of the fail count is calculated and the result stored in R0. In FIG. 17, the average value of the fail count calculated here is shown as <WL31>.

Then, in the step S1705, trimming of Vpgm_init of the word lines WL1 to WL31 is performed using the result stored in R1. The value of k represents the preferred voltage application count. The value of k is stored in the ROM fuse area, etc. In the above stated example where R1 is 6 and k is 2, a value corresponding to 2 is set in the parameter register 802.

Next, in the step S1706, trimming of Vpgm_init of the word line WL3 is performed using the result stored in R0 and R1.

Figure 18:
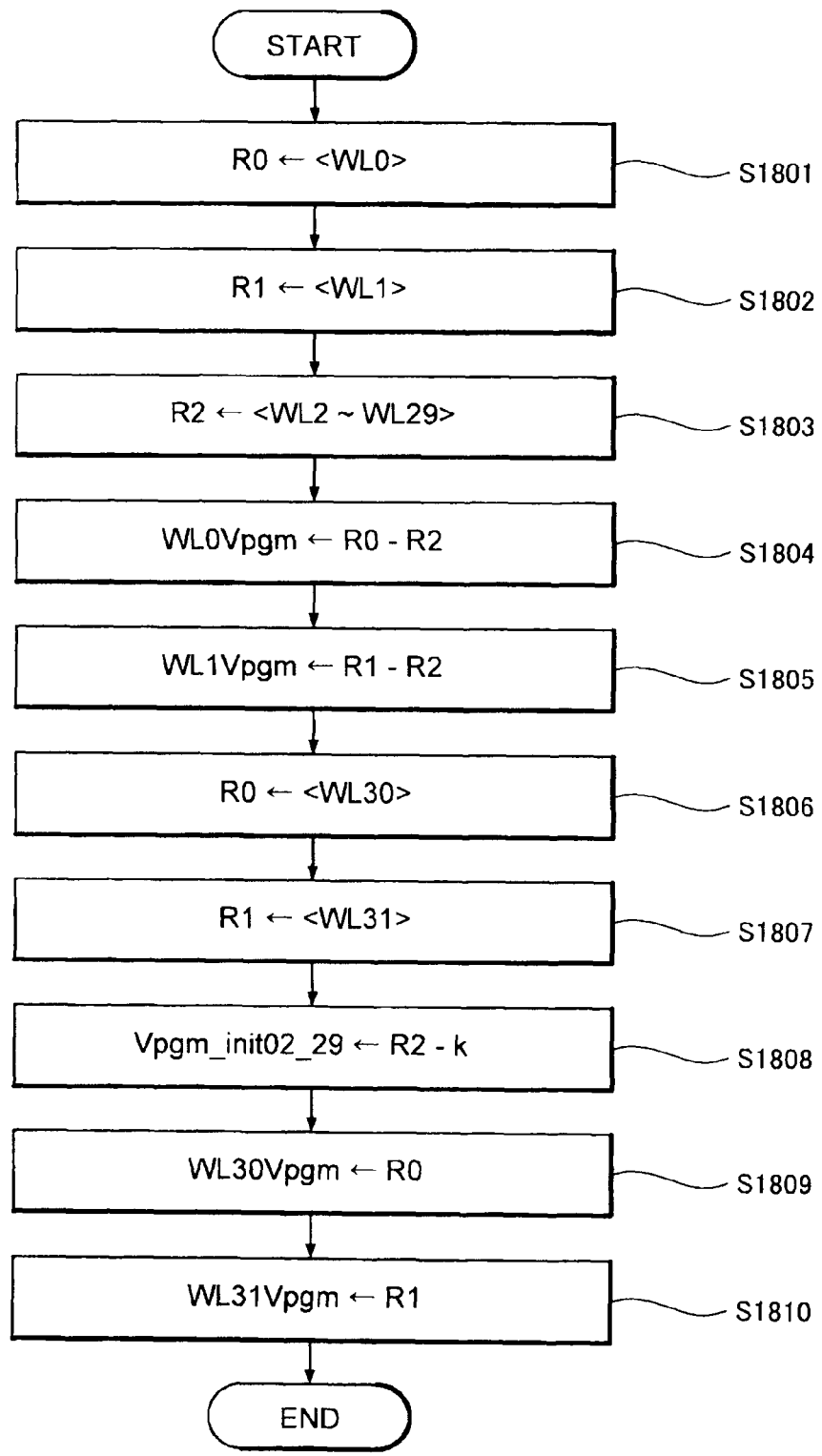
FIG. 18 is a flowchart of trimming of an initial program bias voltage parameter Vpgm_init related one embodiment of the present invention.

In FIG. 17, the processes in the case of trimming Vpgm_init for each of the word lines WL0, WL1 to WL30 and WL31 are shown. Also in the case of trimming Vpgm_init for each of the word lines WL0, WL1, WL2 to WL29, WL30, and WL31, the three registers R0, R1 and R2 are prepared in the Vpgm_init setting circuit 812. Then, the average value of the fail count for the word line WL0, which is shown as <WL0> in FIG. 18, is stored in R0 in the step S1801, the average value of the fail count for the word line WL1, which is shown as <WL1> in FIG. 18, is stored in R1 in the step S1802, and the average value of the fail count for the word lines WL2 to WL29, which is shown as <WL2~WL29>, is stored in R2 in S1803.

Then, in the steps S1804 and S1805, the trimming operation of WL0Vpgm and WL1Vpgm for calculating Vpgm_init of the word lines WL0 and WL1 is performed by preparing the values which are stored in R0, R1 and R2. Next, in the step S1806 the average value of the fail count for the word line WL30, which is represented as <WL30> in FIG. 18, is stored in R0 and in the step S1807 the average value of the fail count for the word line WL31, which is represented as <WL31> in FIG. 18, is stored in R1.

Next, the trimming operation of Vpgminit02_29 for calculating Vpgm_init of the word lines WL2 to WL29 is performed by using the values which are stored in R2 in the step S1808 and the trimming operation of WL30Vpgm, and WL31Vpgm for calculating Vpgm_init for the word lines WL30 and WL31 is performed by preparing the values which are stored in R0 and R1 in the step S1810.

By performing the processes as stated above, it is possible to perform a trimming operation of Vpgm_init according to the positions of word lines by three registers, the number of which is less than the five word lines sections WL0, WL1, WL2 to WL29, WL30, and WL31.

Fourth Embodiment

As the fourth embodiment of the present invention, a trimming of Vpgm_Init is explained such that it is performed according to the positions of word lines. An equivalent circuit diagram of a series of memory cells in the memory cell array 21 is shown in FIG. 2. As shown in FIG. 2, in a nonvolatile semiconductor memory device, blocks are arranged in the direction of arrangement of word lines, SGS, SGD. And in order for a wire which is connected to a source line SL to be shared between adjacent blocks, the word line, SGS and SGD are arranged so that adjacent blocks are in a mirror image relationship. A mirror image relationship refers to the fact in which the arrangements of the word lines, SGS, and SGD in the adjacent blocks are in the relationship of the line symmetry. For example, the distance between SGS of adjacent blocks becomes smaller than the distance between SGD, and reversely, the distance between SGS of adjacent blocks becomes larger than the distance between SGD.

In the case where word lines, SGS, and SGD are arranged so that adjacent blocks are in a mirror image relationship, a difference occurs in the physical shape of adjacent blocks because a light is shone from a diagonal direction and exposure is performed in the manufacturing process and a change in the programming characteristics of memory cells in adjacent blocks may also occur. As a result, for example, the programming characteristics of a memory cell of a page of a word line which is adjacent to SGS may be different between adjacent blocks. Thus, it is preferred that trimming of Vpgm_init be performed according to the position of a block.

In the present embodiment, blocks are arranged in a direction in which word lines, SGS and SGD are lined, and adjacent blocks in this line are in a mirror image relationship. Then, an even numbered block is called an even block and an odd numbered block is called an odd block. In addition, thirty-two word lines are arranged in each block and are called WL0, WL1, . . . , and WL31 from the direction starting from SGS. Trimming of Vpgm_init is performed for the word lines WL0 and WL31 according to whether they belong to an even numbered block or an odd numbered block, and trimming of Vpgm_init is performed for the word lines WL1 to WL30 without distinguishing between even blocks or odd blocks.

That is, when values of parameters which represent initial program bias voltages of pages of WL0 of even blocks, WL0 of odd blocks, WL1 to WL30 of pages of both odd blocks and even blocks, WL31 of pages of even blocks, and WL31 of pages of odd blocks are respectively set as Vpgm_init0even, Vpgm_init0odd, Vpgm_init01_30, Vpgm_init31even, Vpgm_init31odd, trimming is performed of WL0evenVpgm, WL0oddVpgm, Vpgm_init01_30, WL31evenvpgm, and WL31oddvpgm so that the following equations hold.

Figure 19:
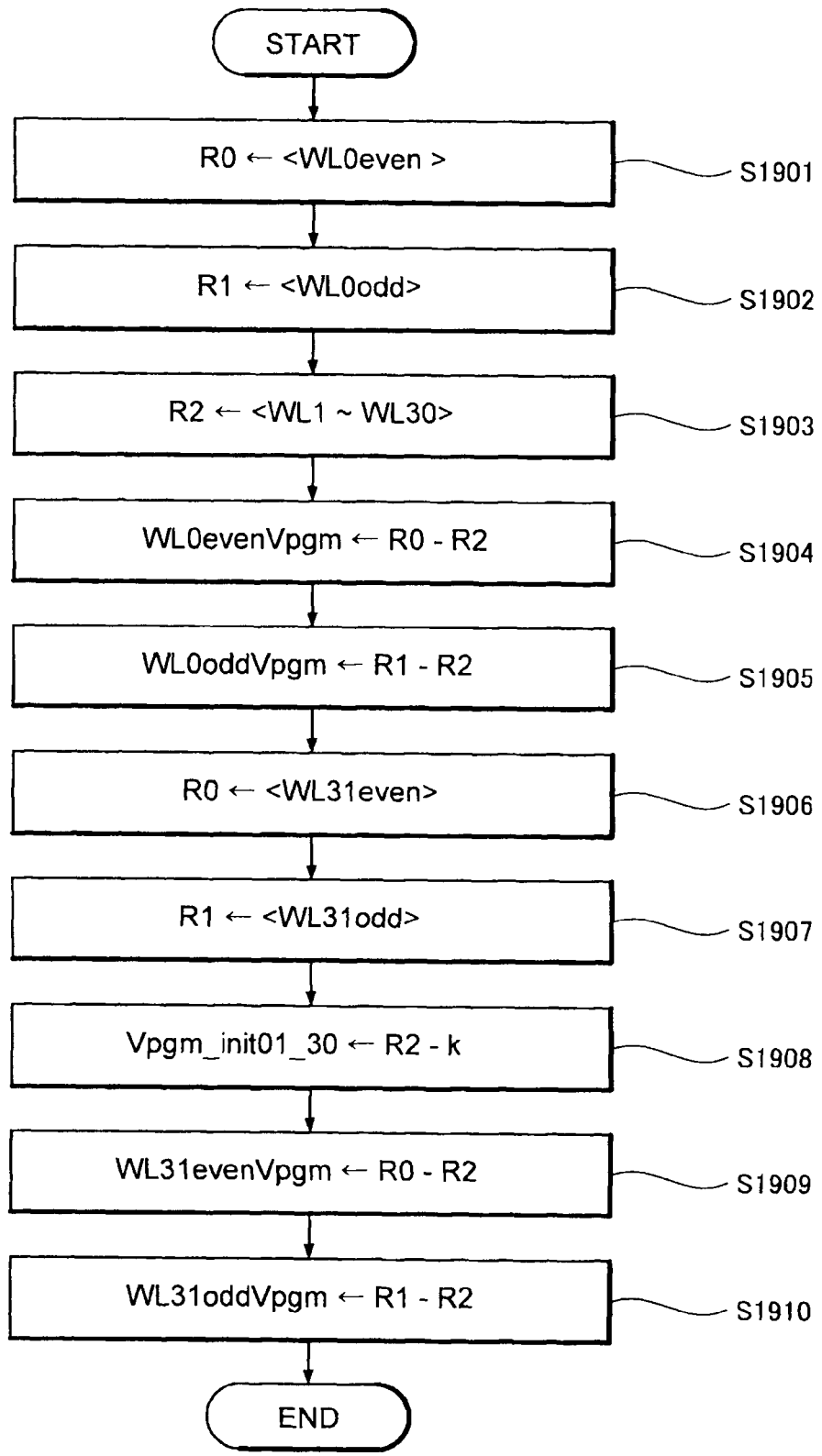
FIG. 19 is a flowchart of trimming of an initial program bias voltage parameter Vpgm_init related one embodiment of the present invention.

$Vpgm\_init0even=Vpgm\_init01\_30+WL0evenVpgm,$ $Vpgm\_init0odd=Vpgm\_init01\_30+WL0oddVpgm,$ $Vpgm\_init31even=Vpgm\_init01\_30+WL31evenVpgm,$ and $Vpgm\_init31odd=Vpgm\_init01\_30+WL31oddVpgm.$ FIG. 19 shows a flowchart which explains the flow of a trimming process in the present embodiment. In the step S1901, using processes of the flowchart of FIG. 9 or FIG. 13 except the point that setting and generation of an addresses of pages of WL0 of even blocks are performed in the steps S901 and S912 respectively, the processes other than the step S914 are performed and an average value of the fail count (written as <WL0even> in FIG. 19) is stored in the register R0. In the step S1902, using the processes of the flowchart in FIG. 9 or FIG. 13 except the point that setting and generation of addresses of pages of WL0 of odd blocks the steps S901 and S912 are performed respectively, the processes other than the step S914 are performed and an average value of a fail count (written as <WL0odd> in FIG. 19) is stored in the register R1.

In the step S1903, using the processes of the flowchart in FIG. 9 and FIG. 13, even numbered blocks and odd numbered blocks are not distinguished and setting and generation of addresses of pages of the word lines WL1 to WL30 are performed respectively in the steps S901 and S912, the processes other than the step S914 are performed and an average value of a fail count (written as <WL1 to WL30> in FIG. 19) is stored in the register R2.

In the process in the step S1904, a value corresponding to R0-R2 is set at WL0evenVpgm. As a result, an initial program bias voltage when programming to pages of the word lines WL0 of even numbered blocks becomes a voltage value in which (R0-R2)×ΔVpgm is added to an initial program bias voltage of pages of the word lines WL1 to WL30.

In the process in the step S1905, a value corresponding to R1-R2 is set at WL0oddVpgm. As a result, an initial program bias voltage when programming to a page of the word line WL0 of an odd numbered block becomes a voltage value in which (R1-R2)×ΔVpgm is added to an initial program bias voltage for pages of the word lines WL1 to WL30.

In the step S1906, using the processes of the flowchart in FIG. 9 and FIG. 13 except the point that setting and generation of addresses of pages of the word lines WL31 of even numbered blocks are performed respectively in the steps S901 and S912, the processes other than the step S914 are performed and an average value of the fail counts (written as <WL31even> in FIG. 19) is stored in the register R0.

In the step S1907, using the processes of the flowchart in FIG. 9 and FIG. 13 except the point that and generation of addresses of pages of the word lines WL31 of odd numbered blocks are performed respectively in the steps S901 and S912, the processes other than the step S914 are performed and an average value of the fail count (written as <WL31odd> in FIG. 19) is stored in the register R1.

In the process in the step S1908, a value corresponding to R2-k is set at Vpgm_init01_30.

In the processes in the steps S1909 and S1910, values corresponding to R0-R2 and R1-R2 are respectively set to WL31evenVpgm and WL31oddVpgm.

As stated above, the five parameters Vpgm_init0odd, Vpgm_init0even, Vpgm_init01_30, Vpgm_init31even and Vpgm_init31even can be set using the three registers R0, R1 and R2.

Fifth Embodiments

In addition, it is possible to propose a nonvolatile semiconductor memory device arranged with a memory cell array having a plurality of blocks comprised of a plurality of memory cells arranged in the same well, a block address generation circuit which generates a block address indicating a block, an erasure voltage application circuit which applies an erasure voltage to a well of a block indicated by the generated block address, a first counter which counts the number of times (count) an erasure voltage is again repeatedly applied to a well in the case where data which is programmed to the memory cells arranged in a well applied with an erasure or program voltage fails a verification, an accumulation circuit which accumulates the value of the first counter in the case where the count counted by the first counter exceeds a first value, a second counter which counts up the number of data erasure completions in the case where the count counted by the first counter exceeds the first value, a next page address generation circuit which clears the first counter after the accumulation by the accumulation circuit and the count up operation by the second counter, and generates a next page address, and an erasure voltage value setting circuit which sets as an operation parameter the value of an erasure voltage which is applied to a well based on the value of the second counter and the value cumulated by the accumulation circuit. It is possible to reduce the amount of time required to erase data using this type of nonvolatile semiconductor memory device.

As explained above, by arranging a circuit which adjusts an initial program/erasure bias voltage, it is possible to set the initial program/erasure bias voltage according to each characteristic of a nonvolatile semiconductor memory device in which the threshold of a memory cell is controlled while stepping up the voltage which is applied.

What is claimed is:

1. A nonvolatile semiconductor memory device comprising:
   a memory cell array including a plurality of word lines which connect a plurality of memory cells;
   a parameter storage part which stores a parameter related to a programming voltage which is applied to a word line connected to a memory cell to be programmed with data;
   a word line selection circuit which selects a word line among said plurality of word lines which is connected to a memory cell to be programmed with data;
   a voltage application circuit which applies a programming voltage to a word line according to said parameter, said word line being selected by said word line selection circuit;
   a verify circuit which performs verification of data which is programmed to a plurality of memory cells which are connected to said word line selected by said word line selection circuit;
   a control part which outputs a signal for selecting a word line to said word line selection circuit, and repeats the operations of said voltage application circuit until said verification by said verify circuit is successful;
   a calculation circuit which calculates an average value of the number of times said control part repeats said operations of said voltage application circuit per each word line; and
   a parameter setting circuit which sets said parameter using said average value calculated by said calculation circuit.

2. The nonvolatile semiconductor memory device according to claim 1 further comprising:
   a first counter which counts the number of times said voltage application circuit is operated until said verification by said verify circuit is successful;
   a second counter which counts the number of times said verification is successful if a value of said first counter exceeds a first value;
   an accumulation circuit which accumulates a value counted by said first counter if said value of said first counter exceeds said first value when said verification is successful;
   wherein
   said calculation circuit calculates said average value by dividing a value accumulated by said accumulation circuit by a value of said second counter.

3. The nonvolatile semiconductor memory device according to claim 2, wherein said calculation circuit performs a bit shift calculation on said value accumulated by said accumulation circuit to perform said division when said value of said second counter becomes a power of two.

4. The nonvolatile semiconductor memory device according to claim 2, wherein said accumulation circuit accumulates a value in which a second value is deducted from said value of said second counter, and said calculation circuit calculates a value in which said second value is added to the result of said division.

5. The nonvolatile semiconductor memory device according to claim 2, wherein when said value of said first counter exceeds a third value said control part outputs a signal for selecting the next word line to said word line selection circuit, and said word line selection circuit selects said next word line without accumulating a value counted by said first counter by said accumulation circuit.

6. The nonvolatile semiconductor memory device according to claim 1, wherein said voltage application circuit is configured to apply a sequence of voltages to said word line selected by said word line selection circuit, starting a voltage corresponding to a value of said parameter, and stepping up every time said voltage application circuit is operated by said control part, and said parameter setting section sets to said parameter a value which represents a voltage applied to said word line at the n-th time where n is equal to a value in which a fourth value is subtracted from said average value.

7. The nonvolatile semiconductor memory device according to claim 1, wherein said memory cell array includes a plurality of blocks, each of plurality of blocks including a first select gate line, a plurality of word lines, and a second select gate line arranged in substantially parallel, and said parameter storage part stores a parameter which is set according to the number of word line where each of said plurality of word lines is numbered from said first selection gate line or said second selection gate line.

8. The nonvolatile semiconductor memory device according to claim 7, wherein said parameter storage part stores a parameter related to a programming voltage which is applied to a word line which is adjacent to said first select gate line and or a word line which is adjacent to said second select gate line, and a parameter related to a programming voltage which is applied to all other word lines of said plurality of word lines.

9. The nonvolatile semiconductor memory device according to claim 8, wherein said word line selection circuit selects a word line in order beginning from a word line adjacent to said first select gate line.

10. The nonvolatile semiconductor memory device according to claim 9, wherein said word line selection circuit determines the number of a word line to be selected, selects one block from said plurality of said blocks, and selects the n-th word line in said selected block where n is equal to said determined number of word lines.

11. The nonvolatile semiconductor memory device according to claim 7, wherein said plurality of word lines in adjacent blocks of said plurality of blocks in said memory cell array are in a mirror relationship, and said parameter storage part stores a parameter according to whether the number of word line is an even number or odd number.

12. A nonvolatile semiconductor memory device comprising:
   a memory cell array including a plurality of blocks having a plurality of memory cells, said memory cell array being formed on a well layer;
   a parameter storage part which stores a parameter related to an erasure voltage which is applied when data stored in memory cells of a block is erased;
   a block selection circuit which selects a block in which data is to be erased from memory cells of said block;
   an erasure voltage application circuit which applies an erasure voltage to said well layer according to said parameter;
   a verify circuit which verifies whether data which is stored in memory cells of said selected block is erased or not;
   an erasure control part which outputs a signal for selecting a block to said block selection circuit, and repeats the operations of said erasure voltage application circuit until said verification by said verify circuit is successful;
   a calculation circuit which calculates an average value of the number of times said erase control part repeats said operations of said erasure voltage application circuit per each block; and
   a parameter setting circuit which sets said parameter using said average value calculated by said calculation circuit.

13. The nonvolatile semiconductor memory device according to claim 12 further comprising;
- a first counter which counts the number of times said erasure voltage application circuit is operated until said verification by said verify circuit is successful;
- a second counter which counts the number of times said verification is successful if a value of said first counter exceeds a first value;
- an accumulation circuit which accumulates a value of said first counter if said value of said first counter exceeds said first value and when said verification is successful;
- wherein
- said calculation circuit calculates said average value by dividing a value accumulated by said accumulation circuit by a value of said second counter.

14. The nonvolatile semiconductor memory device according to claim 13, wherein if said value of said first counter exceeds a third value, said control part outputs a signal for selecting the next block to said block selection circuit, and said block selection circuit selects said next block without accumulating a value counted by said first counter by said accumulation circuit.

15. The nonvolatile semiconductor memory device according to claim 12, wherein adjacent blocks of said plurality of blocks in said memory cell array are in a mirror relationship, and said parameter storage part stores a parameter of an even numbered block and a parameter of an odd numbered block.

16. An operation method of a nonvolatile semiconductor memory device comprising:
- reading a value of a parameter related to a programming voltage applied to a word line connected to a memory cell to be programmed with data;
- selecting a word line connected to said memory cell to be programmed from a plurality of word lines which connect a plurality of said memory cells;
- repeating application of a programming voltage according to said value of said parameter to said selected word line until a verification of data programmed to a said plurality of memory cells connected to said selected word line is successful;
- calculating an average value of the number of times said programming voltage is applied to said selected word line according to said parameter per said word line: and
- setting said parameter using said calculated average value.

17. The operation method of a nonvolatile semiconductor memory device according to claim 16, further comprising;
- counting as a first count the number of times said programming voltage is applied to said selected word line according to said parameter until said verification is successful:
- counting as a second count the number of times said verification is successful if said first count exceeds a first value;
- accumulating said first count if said first count exceeds said first value and if said verification is successful; and
- wherein
- said average value is calculated by dividing said accumulated value by said second count.

18. The operation method of a nonvolatile semiconductor memory device according to claim 16, wherein said nonvolatile semiconductor memory device comprises a memory cell array including a plurality of blocks, in each of which a first select gate line, said plurality of word lines, and a second select gate line are arranged in substantially parallel, and said parameter is a parameter related to a said programming voltage which is applied to a word line according to the number of said word line where each of said plurality of word lines is numbered from said first selection gate line or said second selection gate line.

19. The operation method of a nonvolatile semiconductor memory device according to claim 18, wherein said parameter is a parameter related to a programming voltage which is applied to a word line which is adjacent to said first select gate line and/or said second select gate line, and a parameter related to a programming voltage which is applied to all other word lines of said plurality of word lines.

20. The operation method of a nonvolatile semiconductor memory device according to claim 18, wherein said word line selection is performed in order beginning from a word line adjacent to said first select gate line.

* * * * *